(12) United States Patent
Koike et al.

(10) Patent No.: US 11,514,964 B2
(45) Date of Patent: Nov. 29, 2022

(54) STORAGE CIRCUIT PROVIDED WITH VARIABLE RESISTANCE ELEMENTS, REFERENCE VOLTAGE CIRCUIT AND SENSE AMPLIFIER

(71) Applicant: TOHOKU UNIVERSITY, Sendai (JP)

(72) Inventors: Hiroki Koike, Sendai (JP); Tetsuo Endoh, Sendai (JP)

(73) Assignee: TOHOKU UNIVERSITY, Sendai (JP)

( * ) Notice: Subject to any disclaimer, the term of this patent is extended or adjusted under 35 U.S.C. 154(b) by 0 days.

(21) Appl. No.: 16/770,411

(22) PCT Filed: Dec. 10, 2018

(86) PCT No.: PCT/JP2018/045354
§ 371 (c)(1),
(2) Date: Aug. 11, 2020

(87) PCT Pub. No.: WO2019/112068
PCT Pub. Date: Jun. 13, 2019

(65) Prior Publication Data
US 2020/0381032 A1 Dec. 3, 2020

(30) Foreign Application Priority Data
Dec. 8, 2017 (JP) .............................. JP2017-236524

(51) Int. Cl.
*G11C 11/16* (2006.01)
(52) U.S. Cl.
CPC ...... *G11C 11/1673* (2013.01); *G11C 11/1659* (2013.01)

(58) Field of Classification Search
None
See application file for complete search history.

(56) References Cited

U.S. PATENT DOCUMENTS

| | | | |
|---|---|---|---|
| 9,697,895 B1 | 7/2017 | Zaitsu | |
| 10,665,282 B2 * | 5/2020 | Koike | ................. G11C 11/1673 |

(Continued)

FOREIGN PATENT DOCUMENTS

| | | | |
|---|---|---|---|
| JP | 2002197853 A | 7/2002 | |
| JP | 2002260377 A | 9/2002 | |

(Continued)

OTHER PUBLICATIONS

A Google Translation of JP 2011-065701 A (published Mar. 31, 2011) (Year: 2011).*

(Continued)

*Primary Examiner* — J. H. Hur
(74) *Attorney, Agent, or Firm* — Greer Burns & Crain Ltd.

(57) ABSTRACT

A storage circuit (11) includes memory cells (MCij), each of which includes an MTJ element, and reference cells (RCi), each of which includes a series circuit of an MTJ element set to a low-resistance state and a linear resistor (FR). A RW circuit (23j) that includes a sense amplifier is provided in each column of a memory cell array (21), and compares a data voltage on a corresponding bit line (BLj) with a reference voltage. The sense amplifier includes a pair of PMOS transistors to which the data voltage and the reference voltage are applied, a CMOS sense latch that is connected to a current path of the PMOS transistors.

8 Claims, 19 Drawing Sheets

(56) References Cited

U.S. PATENT DOCUMENTS

| | | | |
|---|---|---|---|
| 2006/0146625 A1* | 7/2006 | Morita | G11C 11/22 365/52 |
| 2007/0280021 A1 | 12/2007 | Ueda et al. | |
| 2010/0073999 A1* | 3/2010 | Kitai | G11C 16/28 365/163 |
| 2013/0268795 A1* | 10/2013 | Nomura | G06F 1/3225 713/324 |
| 2013/0322161 A1 | 12/2013 | Noguchi et al. | |
| 2014/0050010 A1* | 2/2014 | Toda | G11C 13/0023 365/148 |
| 2014/0334222 A1* | 11/2014 | Bateman | G11C 7/22 365/148 |
| 2016/0078915 A1 | 3/2016 | Katayama | |
| 2018/0137913 A1* | 5/2018 | Kim | G11C 13/004 |

FOREIGN PATENT DOCUMENTS

| | | | |
|---|---|---|---|
| JP | 2003257177 A | 9/2003 | |
| JP | 2003281880 A | 10/2003 | |
| JP | 2003317467 A | 11/2003 | |
| JP | 2003346475 A | 12/2003 | |
| JP | 2004046962 A | 2/2004 | |
| JP | 2004103202 A | 4/2004 | |
| JP | 2005518627 A | 6/2005 | |
| JP | 2009238327 A | 10/2009 | |
| JP | 2011065701 A | 3/2011 | |
| JP | 2011204287 A | 10/2011 | |
| JP | 2013161502 A | 8/2013 | |
| JP | 5492324 B1 | 5/2014 | |
| JP | 2015052938 A | 3/2015 | |
| WO | 2008044300 A1 | 4/2008 | |
| WO | 2015083754 A1 | 6/2015 | |
| WO | 2016186086 A1 | 11/2016 | |
| WO | 2019112068 A1 | 6/2019 | |

OTHER PUBLICATIONS

T. Ohsawa et al., "Hi-Density and Low-Power Nonvolatile Static Random Access Memory Using Spin-Transfer-Forque Magnetic Tunnel Junction", Japanese Journal of Applied Physics 51, 2012, pp. 02BD01-1-02BD01-6.

S. Yamamoto et al., "Nonvolatile Static Random Access Memory Using Magnetic Tunnel Junctions with Current-Induced Magnetization Switching Architecture", Japanese Journal of Applied Physics 48, 2009, pp. 043001-1-043001-7.

K. Abe et al., "Hierarchical Cache Memory based on MRAM and Nonvolatile SRAM with Perpendicular Magnetic Funnel Junctions for Ultra Low Power System", Solid State Devices Materials 2010, pp. 1144-1145.

U.S. Appl. No. 15/101,809, filed Jun. 3, 2016, now Patent No. 9,633,708, issued Apr. 25, 2017.

U.S. Appl. No. 15/573,904, filed Aug. 13, 2018, now Patent No. 10,665,282, issued May 26, 2020.

ISR issued in Int'l. Application No. PCT/JP2018/045354, dated Jan. 15, 2019.

Preliminary reporton patentability issued in PCT/JP2016/064531, dated Jan. 17, 2017.

Written opinion issued in PCT/JP2016/064531, dated Aug. 2, 2016.

Written opinion issued in PCT/JP2014/082040, dated Jan. 13, 2015.

Notice of reasons for refusal issued in Japanese application No. 2015-551550, dated Apr. 10, 2018.

Tetsuo Endoh et al.; U.S. Appl. No. 17/395,210, filed Aug. 5, 2021.

\* cited by examiner

SENSE AMPLIFIER

BIT LINE DRIVER 118

(a)

(b)

(c)

STORAGE CIRCUIT PROVIDED WITH VARIABLE RESISTANCE ELEMENTS, REFERENCE VOLTAGE CIRCUIT AND SENSE AMPLIFIER

TECHNICAL FIELD

The present disclosure relates to a storage circuit provided with variable resistance elements as memory cells, and sense amplifiers.

BACKGROUND ART

When reading storage data from memory cells configured from variable resistance elements, the voltage of the bit lines is caused to vary in accordance with the data stored in the memory cells, and this voltage is compared with a reference voltage to determine the storage data.

As such, the configuration and the operation of the circuit that generates the reference voltage is important. Accordingly, many storage circuits have been proposed that include variable resistance elements as memory cells, and reference circuits.

For example, Patent Literature 1 discloses a storage circuit including variable resistance memory cells, a circuit that converts the resistance values of the memory cells to data voltage, a reference circuit that includes a series circuit consisting of a variable resistance element set to low resistance and a linear resistor, a circuit that converts the resistance value of the reference circuit to a reference voltage, and a sense amplifier that amplifies and latches a difference between the data voltage and the reference voltage.

CITATION LIST

Patent Literature

Patent Literature 1: International Publication No. WO 2016/186086
Patent Literature 2: International Publication No. WO 2015/083754

SUMMARY OF INVENTION

Technical Problem

With the configuration of the reference circuit disclosed in Patent Literature 1, one row of reference cells is arranged for a plurality of rows of memory cells. Consequently, the transmission distance to the sense amplifier of the signal differs for each row to which the memory cell to be read belongs, which causes differences in read times to occur. In other words, the transmission distance of the read signal from the memory cells to the sense amplifier differs for each row. As a result, the read speed is limited by the long reading time from the memory cells of the row farthest from the sense amplifier.

As such, from the standpoint of increasing read speed, the storage device disclosed in Patent Literature 1 has room for improvement.

In order to increase the read speed, the operating speed of the sense amplifier itself must be increased. However, Patent Literature 1 does not mention increasing the operating speed of the sense amplifier itself. In addition, FIG. 13 of Patent Literature 2 illustrates a sense amplifier that has a configuration in which the bit lines and the reference lines are received by the drain. However, with such a circuit configuration, all of the resistances and capacitances on the bit lines and the reference lines are loads on the latch circuit. Consequently, time is required to drive the loads and the operation of the sense amplifier is slow.

The present disclosure is made with the view of the above situation, and an objective of the present disclosure is to provide a storage circuit that includes variable resistance elements that can be read at high speed.

Additionally, an objective of the present disclosure is to provide a sense amplifier capable of high-speed operation.

Solution to Problem

A storage circuit according to a first aspect of the present disclosure that achieves the objective described above includes:

memory cells each including a variable resistance element, the memory cells being arranged in a matrix of m rows and n columns, where m and n are nonnegative integers and at least one of m and n is 2 or greater;

a resistance voltage conversion circuit that is arranged for each column of the memory cells, and that converts a resistance value of a memory cell to be read to a data voltage;

a reference circuit that has a same configuration as the variable resistance element of each of the memory cells, that includes a series circuit of a fixed resistor and a variable resistance element set to low resistance, and that is arranged in m rows and one column;

a reference voltage conversion circuit that includes a same configuration as the resistance voltage conversion circuit, and that converts a resistance value of the reference circuit to a reference voltage; and a sense amplifier that is arranged in each column, and that determines data stored in the memory cells by comparing the reference voltage with the data voltage output from the resistance voltage conversion circuit of a corresponding column.

A sense amplifier according to a second aspect of the present disclosure that achieves the objective described above is a sense amplifier for reading data stored in memory cells of a storage circuit that includes memory cells that each include a variable resistance element, a resistance voltage conversion circuit that converts resistance values of the memory cells to data voltages, and a reference circuit that generates a reference voltage for determining a level of each of the data voltages; the sense amplifier including:

a pair of (MOS) transistors of a same conductivity that receive, at gates thereof, the data voltages and the reference voltage output from the storage circuit; and a complementary MOS latch that is connected to a current path of the MOS transistors, includes a CMOS circuit, and that amplifies and latches a difference between the data voltage and the reference voltage.

Advantageous Effects of Invention

The storage circuit of the present disclosure includes a sense amplifier for each column. As a result, high-speed reading operations are possible.

In addition, the sense amplifier of the present disclosure includes a pair of MOS transistors of the same conductivity type that receive, at the gates thereof, the data voltage and the reference voltage, and a CMOS latch that amplifies and latches the difference between the data voltage and the reference voltage. As a result, high-speed reading is possible.

BRIEF DESCRIPTION OF DRAWINGS

FIG. 2(c) is a drawing illustrating the configuration of the MTJ element in a low-resistance state;

DESCRIPTION OF EMBODIMENTS

Hereinafter, a storage circuit according to an embodiment of the present disclosure is described while referencing the drawings.

Figure 1:
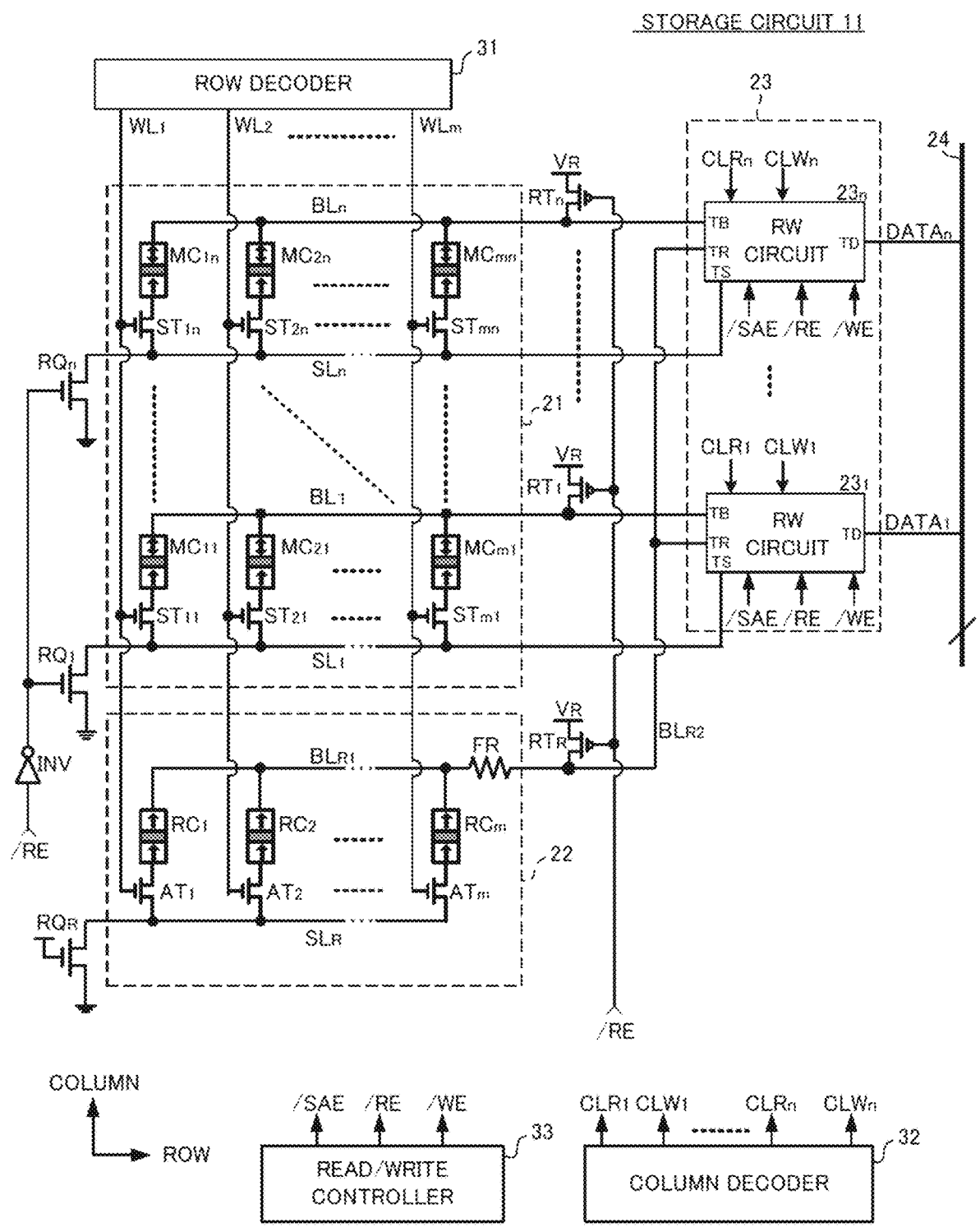
FIG. 1 is a block diagram of a storage circuit according to an embodiment of the present disclosure.

As illustrated in FIG. 1, a storage circuit 11 according to the present embodiment includes a memory cell array 21, a reference cell array 22, a RW circuit array 23, a row decoder 31, a column decoder 32, and a read/write controller 33.

The memory cell array 21 includes memory cells MCij (where i=1 to m, and j=1 to n) arranged in a matrix of m rows and n columns. Here, m and n are each a nonnegative integer.

The reference cell array (reference circuit) 22 is arranged adjacent to the memory cell array 21. The reference cell array 22 includes reference cells RCi (where i=1 to m) arranged in a matrix of m rows and one column, and a common fixed resistor FR.

The memory cells MCij and the reference cells RCi are formed from magnetic tunneling junctions (MTJ), which is an example of a variable resistance element. The memory cells MCij and the reference cells RCi have the same configuration and characteristics. Details thereof are described later while referencing FIG. 2.

The positions in the row direction on a semiconductor substrate of the memory cells MCij and the reference cells RCi of the $i^{th}$ row are set to be equal to each other.

The RW circuit array 23 includes RW circuits 23j (where j=1 to n) arranged in one row and n columns. Each of the RW circuits 23j has a read function and a write function. Specifically, each of the RW circuits 23j includes both i) at a time of a read operation, a sense amplifier function of reading the storage data of the memory cells MCij of the same column, and a function of writing the read data back to the memory cells; and ii) at a time of a write operation, a function of writing write data to the memory cells MCij of the same column. A detailed description of the RW circuits 23j is given later. Note that, in the following description, the RW circuits 23j may be referred to collectively as RW circuits 23.

One end of a current path (source-drain path) of a selection transistor STij is connected to one end of each of the memory cells MCij. Moreover, one end of a current path of a selection transistor ATi is connected to one end of each of the reference cells RCj.

The selection transistors STij and the selection transistors ATi are each formed from an N-channel Metal-Oxide-Semiconductor field-effect (MOS) transistor (hereinafter, "NMOS transistor"), and the drain of each NMOS transistor is connected to one end of each of the memory cells MCij or the reference cells RCi.

The other end of each of the memory cells MCij of the $j^{th}$ column is connected commonly to the bit line BLj arranged in the $j^{th}$ column. One end of the bit line BLj of the $j^{th}$ column is connected to a bit line terminal TB of each of the RW circuits 23j.

The other ends of the reference cells RCi are connected commonly to a reference bit line BLR. One end of the reference bit line BLR is connected commonly to a reference bit line terminal TR of each of the RW circuits 231 to 23n.

A fixed resistor FR is inserted between a connection node of the reference bit line BLR with the reference cell RCm of the mth row and a connection node of the reference bit line BLR with a reference load transistor RTR (described later).

In the following description, in order to differentiate the reference bit line BLR, i) the portion more to the reference cells RCi side from the connection node with the reference load transistor RTR is referred to as a "first reference bit line BLR1", and ii) the portion more to the RW circuit array 23 side from the connection node with the reference load transistor RTR is referred to as a "second reference bit line BLR2."

The material, thickness, and width of the first reference bit line BLR1 are equal to those of the bit lines BLj. However, the cross-sectional area (product of thickness and width) of the second reference bit line BLR2 is formed larger than the cross-sectional area of the first reference bit line BLR1, and the resistance value per unit length of the second reference bit line BLR2 is smaller than the resistance value per unit length of the first reference bit line BLR1.

The other end of the current path of the selection transistors STij of the j$^{th}$ column are connected commonly to a source line SLj arranged in the j$^{th}$ column. One end of the source line SLj is grounded via the current path of a grounding NMOS transistor RQj. The other end of the source line SLj is connected to a source line terminal TS of the RW circuit 23j. A low-active read enable signal /RE is applied to the gates of the grounding NMOS transistors RQj via an inverter INV.

Load transistors RTj, the bit lines BLj, the selection transistors STij, the source lines SLj, and the grounding NMOS transistors RQj cooperate to function as an example of a resistance voltage conversion circuit that converts the resistance value of each of the memory cells MCij of the j$^{th}$ column to a data voltage Vbj.

The other end of the current path of each of the selection transistors ATi is connected commonly to the reference source line SLR. One end of the reference source line SLR is grounded via the current path of a grounding NMOS transistor RQR. The gate of the grounding NMOS transistor RQR is pulled up. The grounding NMOS transistors RQj and RQR have the same configuration and characteristics.

The reference load transistor RTR, the reference bit lines BLR, the selection transistors ATij, the reference source line SLR, and the grounding NMOS transistor RQR cooperate to function as an example of a reference voltage conversion circuit that converts the reference value of each of the reference cells RCi to a reference voltage Vref.

The gates of the selection transistors STij and the selection transistors ATi of the i$^{th}$ row are connected commonly to a word line WLi of the i$^{th}$ row.

One end of a current path of the load transistor RTj is connected to the bit line BLj of the j$^{th}$ column. A read voltage VR is applied to the other end of the current path of the load transistor RTj. The load transistor RTj includes an NMOS transistor and functions as a load at a time of data reading.

One end of a current path of the reference load transistor RTR is connected to the reference bit line BLR. The read voltage VR is applied to the other end of the current path of the reference load transistor RTR. The reference load transistor RTR functions as a load at a time of data reading, and has the same configuration and characteristics as the load transistors RT1 to RTn. Note that, as described above, the connection node with the reference load transistor RTR is the boundary between the first reference bit line BLR1 and the second reference bit line BLR2.

The row decoder 31 decodes a row address from a host device (not illustrated in the drawings), and sets the voltage of the word line WLi, of the row to which the memory cells MCij to be accessed belong, to high-level.

The column decoder 32 decodes a column address from the host device. In accordance with a read/write control signal, the column decoder 32 i) outputs a high-active read column selection signal CLRj to the RW circuit 23j of the column to which the memory cells MCij to be read belong, and ii) outputs a high-active write column selection signal CLWj to the RW circuit 23j of the column to which the memory cells MCij to be written belong.

In accordance with the read/write control signal from the host device (not illustrated in the drawings), at a time of reading, the read/write controller 33 commonly outputs a low-active read enable signal /RE to the gates of the load transistors RTj, and outputs the read enable signal /RE to the gates of the grounding NMOS transistors RQj via the inverter INV and, furthermore, outputs a low-active sense amplifier activation signal to all of the RW circuits 23j; and, in accordance with a read/write control signal from the host device (not illustrated in the drawings), at a time of writing, the read/write controller 33 outputs a low-active write enable signal /WE to all of the RW circuits 23j.

Each of the RW circuits 23j includes a bit line terminal TB, a reference bit line terminal TR, a source line terminal TS, and a data terminal TD. The bit line terminal TB is connected to the bit line BLj of the same column. The reference bit line terminal TR is connected to the second reference bit line BLR2. The source line terminal TS is connected to the source line SLj of the same column. The data terminal TD is connected to a bus 24.

The column decoder 32 supplies the read column selection signal CLRj and the write column selection signal CLWj to each of the RW circuits 23j; and the read/write controller 33 supplies the read enable signal /RE, the write enable signal /WE, and a sense amplifier enable signal /SAE to each of the RW circuits 23j.

When reading data from the memory cells MCij, in response to the read column selection signal CLRj and the sense amplifier enable signal /SAE, the RW circuit 23j of the j$^{th}$ column differentially amplifies the data voltage Vbj supplied to the bit line terminal TB from the bit line BLj and the reference voltage Vref supplied to the reference bit line terminal TR from the second reference bit line BLR2, latches the amplification results, and outputs the amplification results from data terminal TD.

Specifically, if the data voltage Vbj is higher than the reference voltage Vref, the RW circuit 23j latches the data "1", and outputs data DATAj expressing "1" from the data terminal TD. If the data voltage Vbj is lower than the reference voltage Vref, the RW circuit 23j latches the data "0", and output data DATAj expressing "0" from the data terminal TD. After latching the data, in response to the write enable signal /WE becoming low-level, the RW circuit 23j applies voltage corresponding to the latched data between the bit line BLi and the source line SLj, and write the read data back to the memory cells MCij.

In response to the write column selection signal CLWj, the RW circuit 23j of the j$^{th}$ column writes the data to the memory cells MCij to be written by applying voltage, corresponding to the write data "1" or "0" supplied to the data terminal TD via the bus 24, between the bit line BLj and the source line SLj.

Due to the configuration described above, from the perspective of the memory cell MCij of the j$^{th}$ column and i$^{th}$ row and corresponding the reference cell RCi, the read current flows through a route consisting of the load transistor RTj→the bit line BLj→the memory cells MCij→the selection transistors STij→the source line SLj→the grounding NMOS transistor RQj→ground at a time of data reading. Likewise, the read current flows through the reference load transistor RTR→the first reference bit line BLR1→the fixed resistor FR→the reference cells RCi→the selection transistors ATi→the reference source line SLR→the grounding NMOS transistor RQR→ground. In this case, the resistance of the current path of the load transistor RTj when it is ON and the resistance of the current path of the reference load transistor RTR when it is ON are substantially equal to each other. In addition, the resistance (not including the resistance values of the memory cells MCij) of the wiring of the current route from one end (connection point with the bit line BLj) of the load transistor RTj to the ground, and the resistance (not including the resistance values of the reference cells RCi and the fixed resistor FR) of the wiring of the current route from one end (connection point with the first bit line BLR1) of the reference load transistor RTR to the ground are substantially equal to each other.

Figure 2:
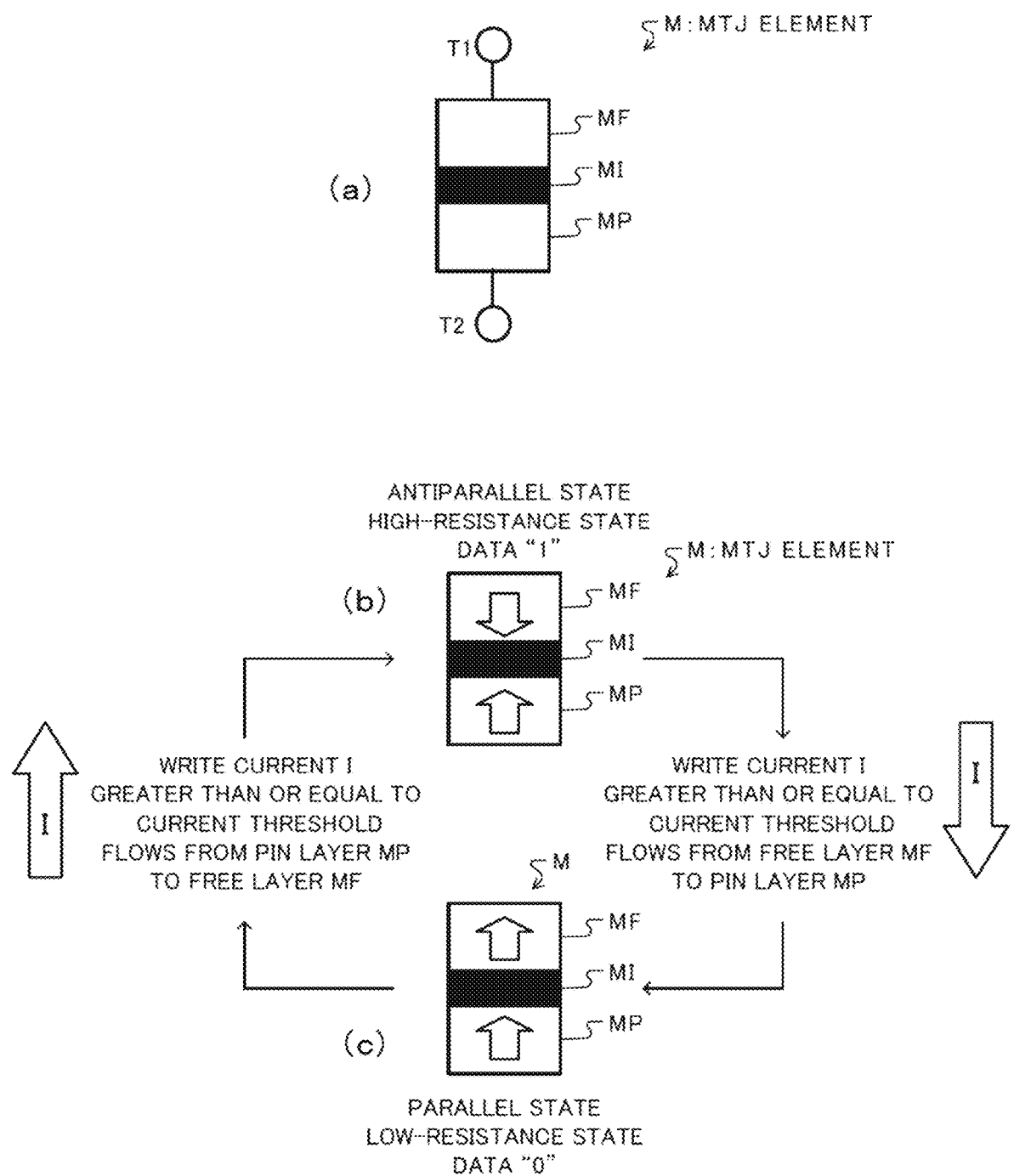
FIG. 2(a) is a drawing illustrating the configuration of a magnetic tunnel junction (MTJ) element.
FIG. 2(c) is a drawing illustrating the configuration of the magnetic tunnel junction (MTJ) element in a high-resistance state.

Next, the memory cells MCij are described while referencing FIG. 2.

Each of the memory cells MCij includes a single two-terminal MTJ element M. As illustrated in FIG. 2(a), the MTJ element M includes three layers, namely a pin (fixed) layer MP, an insulation layer MI, and a free layer MF.

The pin layer MP and the free layer MF are formed from a ferromagnetic material (for example, CoFeB), a ferromagnetic Heusler alloy (for example, Co2FeAl, Co2MnSi), or a similar material.

The magnetization direction of the pin layer MP is fixed and does not change, even when current flows in the pin layer MP.

However, the magnetization direction of the free layer MF is variable and changes when current flows in the free layer MF.

The insulation layer MI is a thin film that is provided between the pin layer MP and the free layer MF. The insulation layer MI includes magnesium oxide (MgO), alumina ($Al_2O_3$), spinel single crystals ($MgAl_2O_4$), or a similar material, for example.

When the magnetization direction of the free layer changes relative to the magnetization direction of the pin layer MP, the resistance value between a first end T1 and a second end T2 of the MTJ element M changes.

In the storage circuit 11 of FIG. 1, the free layers MF of the memory cells MCij of the $i^{th}$ row and the $j^{th}$ column are connected to the bit line BLj of the same column, and the pin layers MP are connected to the selection transistors STij.

As illustrated in FIG. 2(b), a state in which the magnetization directions (indicated by the hollow white arrows) of the pin layer MP and the free layer MF are not aligned (state of parallel and opposite directions) is referred to as an antiparallel state. Meanwhile, as illustrated in FIG. 2(c), a state in which the magnetization directions of the pin layer MP and the free layer MF are the same is referred to as a parallel state.

The resistance value Rap of the MTJ element M when in the antiparallel state is greater than the resistance value Rp when in the parallel state. The resistance state of the MTJ element M in the antiparallel state is referred to as a high-resistance state, and the resistance state of the MTJ element M in the parallel state is referred to as a low-resistance state.

In the present embodiment, the high-resistance state of the MTJ element M corresponds to the data "1", and the low-resistance state corresponds to the data "0."

In the present embodiment, the MTJ element M is set at the high-resistance state when a write current I greater than or equal to a current threshold flows from the pin layer MP to the free layer MF, and set at the low-resistance state when a write current I greater than or equal to the current threshold flows from the free layer MF to the pin layer MP. Accordingly, in order to write the data "1" to the memory cells MCji, current is made to flow from the pin layer MP to the free layer MF, that is, from the source line SLj to the bit line BLj via the selection transistors STij and the memory cells MCij and, in order to write the data "0" to the memory cells MCij, current is made to flow from the free layer MF to the pin layer MP, that is, from the bit line BLj to the source line SLj via the memory cells MCij and the selection transistors STij.

Figure 3:
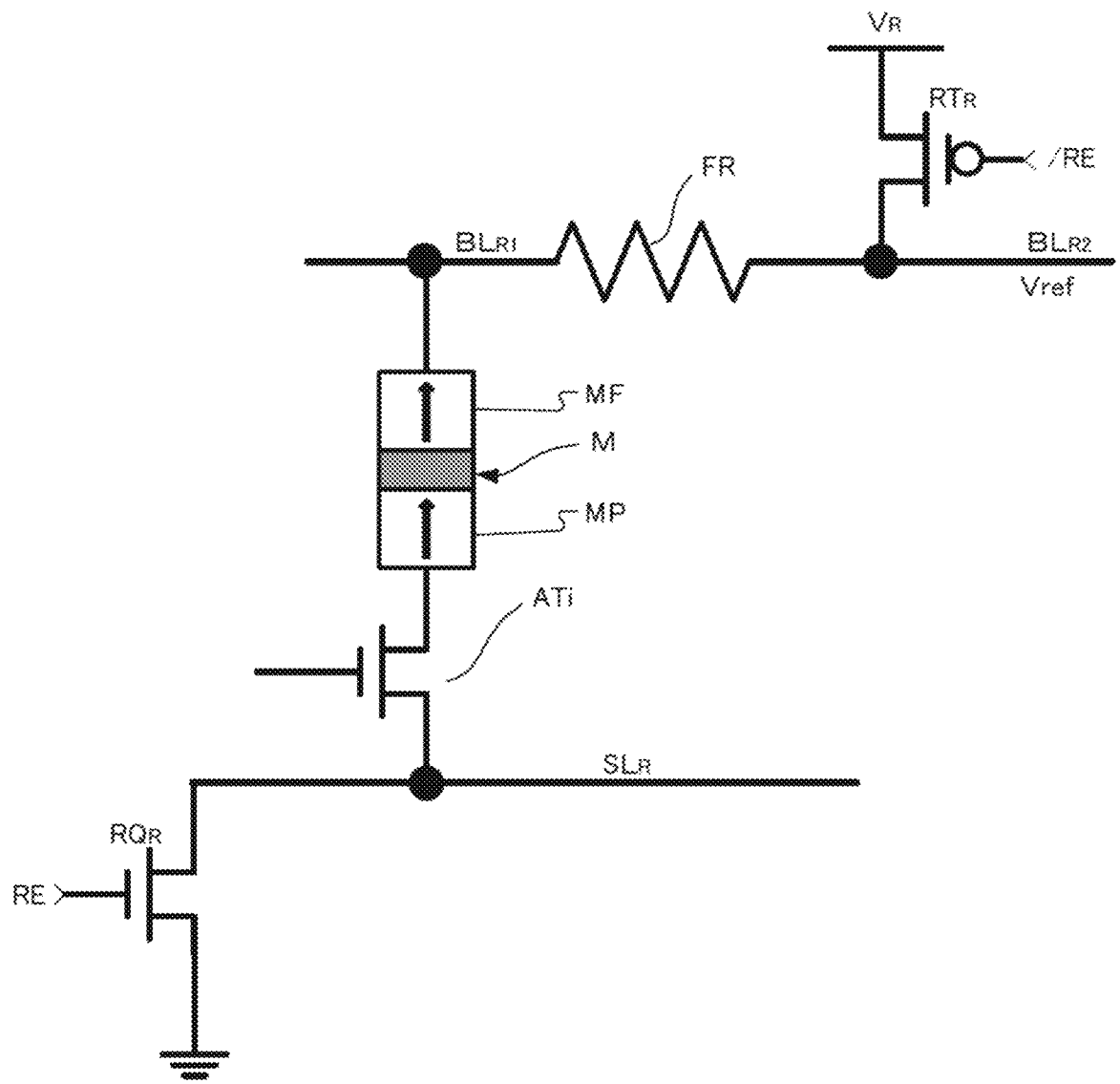
FIG. 3 is a drawing illustrating the configuration of a reference cell depicted in FIG. 1.

Next, the reference circuit that generates the reference voltage Vref is described while referencing FIG. 3.

The reference circuit includes the reference cells RCi and a fixed resistor FR that is shared by the reference cells RCi.

The reference cells RCi have the same structure (material, size, impurity concentration, and the like) as the MTJ elements M of the memory cells MCij. However, as illustrated in FIG. 2(c), the reference cells RCi are set in the low-resistance state (the parallel state) in which the magnetization directions of the pin layers MP and the free layers MF are aligned with each other. Note that, the phrase "same configuration" does not mean completely the same. Provided that both MTJ elements achieve substantially the same functions and operations, slight structural differences are allowable, and should be construed as being within the range of "the same."

The fixed resistor FR is a high precision linear resistor. A resistance value Roffset of the fixed resistor FR is set to a value greater than 0 and less than Rap−Rp (=Rp×MR ratio). Additionally, the resistance value Roffset of the fixed resistor FR is set to a value such that, when reading storage data from the memory cell MC, the difference between the data voltage Vb transmitted to the bit line terminal TB of the RW circuit 23 and the reference voltage Vref applied to the negative input terminal is greater than or equal to the resolution of the RW circuit 23.

Next, the operations of the storage circuit 11 that is provided with the configuration described above are described.

Figure 4:
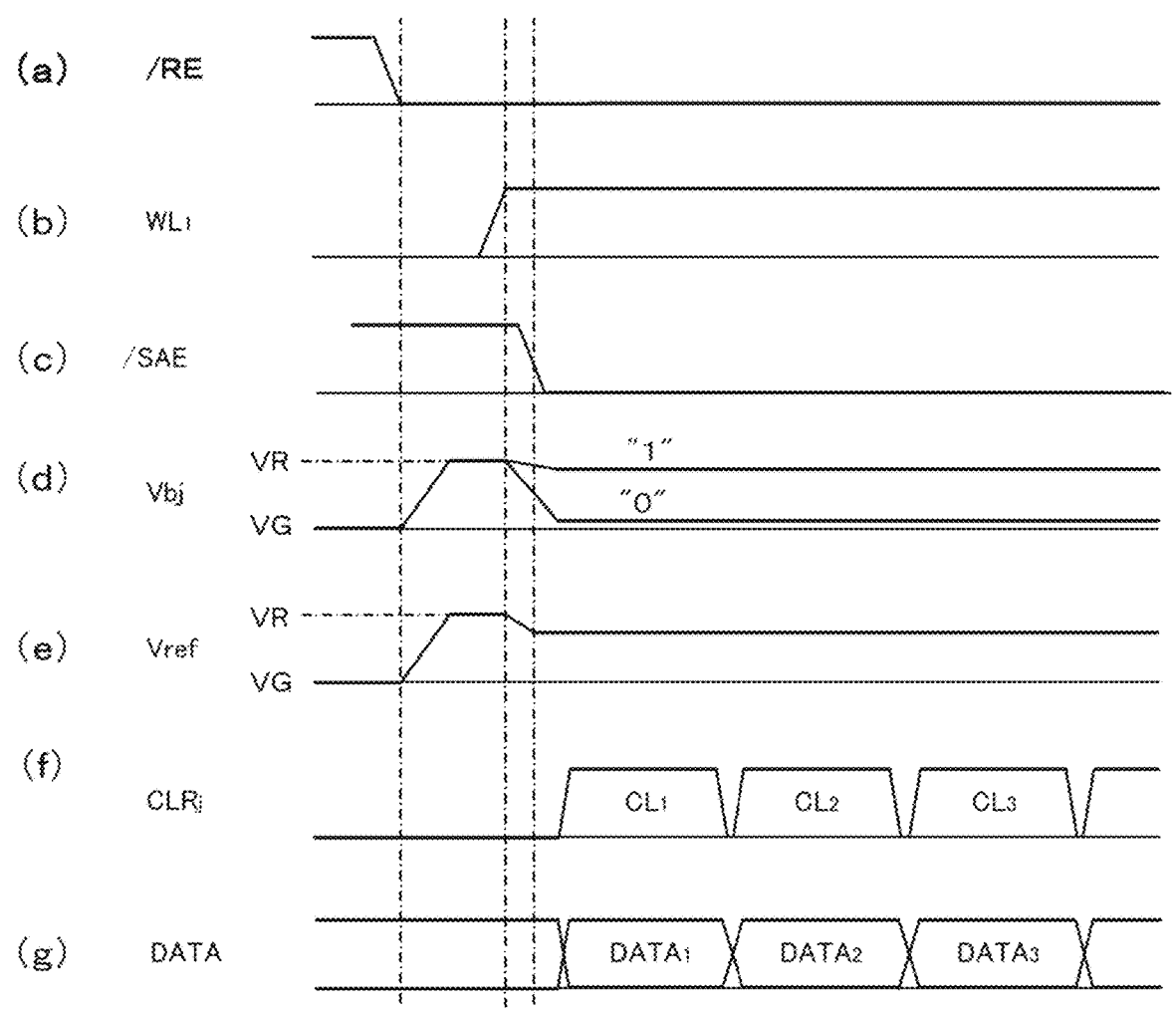
FIGS. 4(a) to 4(g) are a timing chart for explaining a read operation of the storage circuit depicted in FIG. 1.

First, a read operation will be described while referencing the timing chart of FIG. 4.

Here, to facilitate comprehension, an example of data reading is described using a page mode in which the storage data of a plurality of memory cells MC of the same row is sequentially read.

Assume that the row to be read is the first row, and the storage data is read in order of memory cell MC11 of first row first column→memory cell MC12 of first row second column→ . . . →memory cell MC1n of first row nth column.

First, in order to perform the reading, as illustrated in FIG. 4(a), the read/write controller 33 sets the read enable signal /RE to low-level, which is the active level.

In response to the read enable signal /RE being set to low-level, all of the load transistors RT1 to RTn and the reference load transistor RTR turn ON. The read enable signal /RE is inverted by the inverter INV and supplied to the gates of the grounding NMOS transistors RQ1 to RQn, and all of the grounding NMOS transistors RQ1 to RQn are turned ON. Additionally, all of the RW circuits 231 to 23n are set to read mode. As a result, as illustrated in FIGS. 4(d) and 4(e), all of the bit lines BL1 to BLn and the reference bit line BLR are charged with the read voltage VR.

Next, in order to access the memory cells MC1j of the first row, as illustrated in FIG. 4(b), the row decoder 31 sets the voltage of the word line WL1 to high-level, and maintains the other word lines WL at low-level. The selection transistors ST11 to ST1n and AT1 of the first row turn ON as a result of the voltage of the word line WL1 being set to high-level.

As a result, in each column, the current flows through the load transistor RTj→the bit line BLj→the memory cell MC1j→the selection transistor ST1j→the source line SLj→the grounding NMOS transistor RQj→ground and, as illustrated in FIG. 4(d), data voltage Vbj corresponding to the resistance value of the memory cells MC1j is generated in the bit line BLj. The timing at which the data voltage Vbj arrives at the RW circuit 23j is substantially the same for all of the columns.

Likewise, the current flows through the reference load transistor RTR→the reference bit line BLR→the reference cell RC1→the selection transistor AT1→the reference source line SLR→the grounding NMOS transistor RQR→ground and, as illustrated in FIG. 4(e), reference voltage Vref corresponding to the sum (combined resistance) of the resistance value of the reference cell RC1 and the resistance value of the fixed resistor FR is generated in the second reference bit line BLR2. This reference voltage is constant during the read operation and is applied in parallel to the RW circuits 23j.

As a result, the reference voltage Vref is applied to the reference bit line terminal TR and the data voltage Vbj is applied to the bit line terminal TB of the RW circuit 23j of the $j^{th}$ column.

Here, as illustrated in FIG. 4(c), the read/write controller 33 sets the sense amplifier enable signal /SAE to low-level (active). In response to the lowering of the sense amplifier enable signal /SAE, the RW circuit 23j differentially amplifies the data voltage Vbj and the reference voltage Vref, and latches the amplified data.

The column decoder 32 decodes the column address, and as illustrated in FIG. 4(f), sequentially sets the read column selection signals CLR1 to CLRn to high-level in accordance with the read/write control signal.

As a result, as illustrated in FIG. 4(g), the data DATA1 to DATAn, latched internally in the RW circuits 231 to 23n, are sequentially output to the bus 24. The bus 24 transmits the output data DATA1 to DATAn to the host device.

At the timing when the transmission of the data DATA1 to DATAn is completed, the column decoder 32 sets the write column selection signals CLW1 to CLWn to high-level, and the read/write controller 33 sets the read enable signal /RE to high-level and the write enable signal /WE to low-level.

In response to these signals, when the latched data is "1", the RW circuit 23j sets the voltage of the source line SLj to high-level and the voltage of the bit line BLj to low-level. As a result, the write current I flows through the source line terminal TS of the RW circuit 23j→the source line SLj→the selection transistors STij→the memory cells MCij→the bit lines BLj→the bit line terminal TB of the RW circuit 23j, and the data "1" is written to the memory cells MCij. Meanwhile, when the latched data is "0", the RW circuit 23j sets the voltage of the bit line BLj to high-level and the voltage of the source line SLj to low-level. As a result, the write current I flows through the bit line terminal TB of the RW circuit 23j→the bit line BLj→the memory cells MCij→the selection transistors STij→the source line SLj→the source line terminal TS of the RW circuit 23j, and the data "0" is written to the memory cells MCij.

Thus, each piece of data read from the memory cells MCij is written to the original memory cell MCij. As such, corruption of the data due to the reading is prevented.

As described above, the storage circuit 11 according to the present embodiment is capable of reading in so-called page mode, in which the storage data is read while sequentially changing the column address without changing the row address. Moreover, reading from the first column to the nth column is possible by performing the sensing processing and the latching processing in parallel in the RW circuits 23j and, thereafter, switching the column. As such, high-speed reading is possible.

Then, the same operations are repeated in accordance with the row address and the column address of the memory cell MC to be read.

Note that the reading is not limited to page mode and it is possible to read the storage data by sequentially changing the row address and the column address to access the memory cell MC.

In the configuration described above, i) the configurations of the memory cells MCij and the reference cells RCj are the same, ii) the memory cells MCij are arranged in m rows and n columns and the reference cells RCj are arranged in m rows and one column, iii) the resistance voltage conversion circuit is arranged for each column of the memory cells MCij and the reference voltage conversion circuit is arranged for the column of the reference cells RCj, and iv) the RW circuit 23j that includes the sense amplifier is arranged for each column of the memory cells MCij. As such, an appropriate data voltage Vbj and reference voltage Vref can be generated, regardless of the position of the memory cell MC to be read. Moreover, differences in transmission delays for the data voltage Vbj and the reference voltage Vref to reach the RW circuit 23j can be kept small, and the operations of the sense amplifier can be accelerated a corresponding amount.

Furthermore, in the configuration described above, a RW circuit 23 that includes a sense amplifier is arranged for each column. As a result, reading in so-called page mode, in which the storage data is read while sequentially changing the column address without changing the row address (in other words, reading the memory cells of the same row) is possible. That is, by reading from the first column to the nth column by performing the sensing processing and the latching processing in parallel in one RW circuit 23 and, thereafter switching the column, the operations of reading the memory cells within the same row can be performed even faster.

A more detailed description of this advantageous effect is as follows. In the configuration described above i) the configurations of the memory cells MCij and the reference cells RCj are the same; ii) the configurations of the selection transistors STij and the selection transistor ATi are the same; iii) the length of the bit lines BL from the memory cells MCij to be read to the load transistors RTj and the length of the first reference bit line BLR1 from the reference cell RCi to be accessed to the reference load transistor RTR are equal, the configurations of the bit lines BLj and the first reference bit line BLR1 are the same, and the second reference bit line BLR2 is comparatively thick and the current flowing therethrough is small, and, therefore, the voltage drop at the second reference bit line BLR2 is small; iv) the configurations of the load transistors RTj and the reference load transistor RTR are the same; v) the length of the source lines SLj from the selection transistors STij connected to the memory cells MCij to be read to the grounding NMOS transistors RQj and the length of the reference source line SLR from the reference cells RCi to be accessed to the grounding NMOS transistor RQR are equal, and the configurations of the source lines SLj and the reference source line SLR are the same; and vi) the configurations of the grounding NMOS transistors RQj and the grounding NMOS transistor RQR are the same. Accordingly, an appropriate reference voltage Vref can be generated, regardless of the position of the memory cell MC to be accessed.

Next, a write operation is described. In this case, data is written to the memory cells MCij.

First, in accordance with a read/write control signal, the read/write controller 33 sets the write enable signal /WE to low-level.

The row decoder 31 decodes the row address, and sets the voltage of the word line WLi of the $i^{th}$ row to which the memory cells MCij to be written belong to high-level.

The column decoder 32 decodes the column address, and supplies a write column selection signal CLWj to the RW circuit 23j of the $j^{th}$ column to which the memory cell MCij to be written belong.

Write data of "1" or "0" is output to the bus 24. This data is transmitted to the RW circuit 23j.

The RW circuit 23j performs write operations in response to the low-level write enable signal /WE and the high-level write column selection signal CLWj and, when the supplied write data is "1", set the voltage of the source line SLj to high-level and the voltage of the bit line BLj to low-level. As a result, the write current I flows through the source line terminal TS of the RW circuit 23j→the source line SLj→the selection transistors STij→the memory cells MCij→the bit line BLj→the bit line terminal TB of the RW circuit 23j, and the data "1" is written to the memory cells MCij.

Meanwhile, when the supplied write data is "0", the RW circuit 23j sets the voltage of the bit line BLj to high-level and the voltage of the source line SLj to low-level. As a result, the write current I flows through the bit line terminal TB of the RW circuit 23j→the bit line BLj→the memory cells MCij→the selection transistors STij→the source line SLj→the source line terminal TS of the RW circuit 23j, and the data "0" is written to the memory cells MCij.

Thus, with the storage circuit 11 according to the present embodiment, it is possible to implement MTJs as memory cells, generate an appropriate reference voltage, read the storage data at high-speed, write back the read data, and write the data.

In the configuration described above, the operating speed of the RW circuit 23j is critical to achieving high-speed reading. As such, hereinafter, a preferable configuration of the RW circuit 23 is described.

Figure 5:
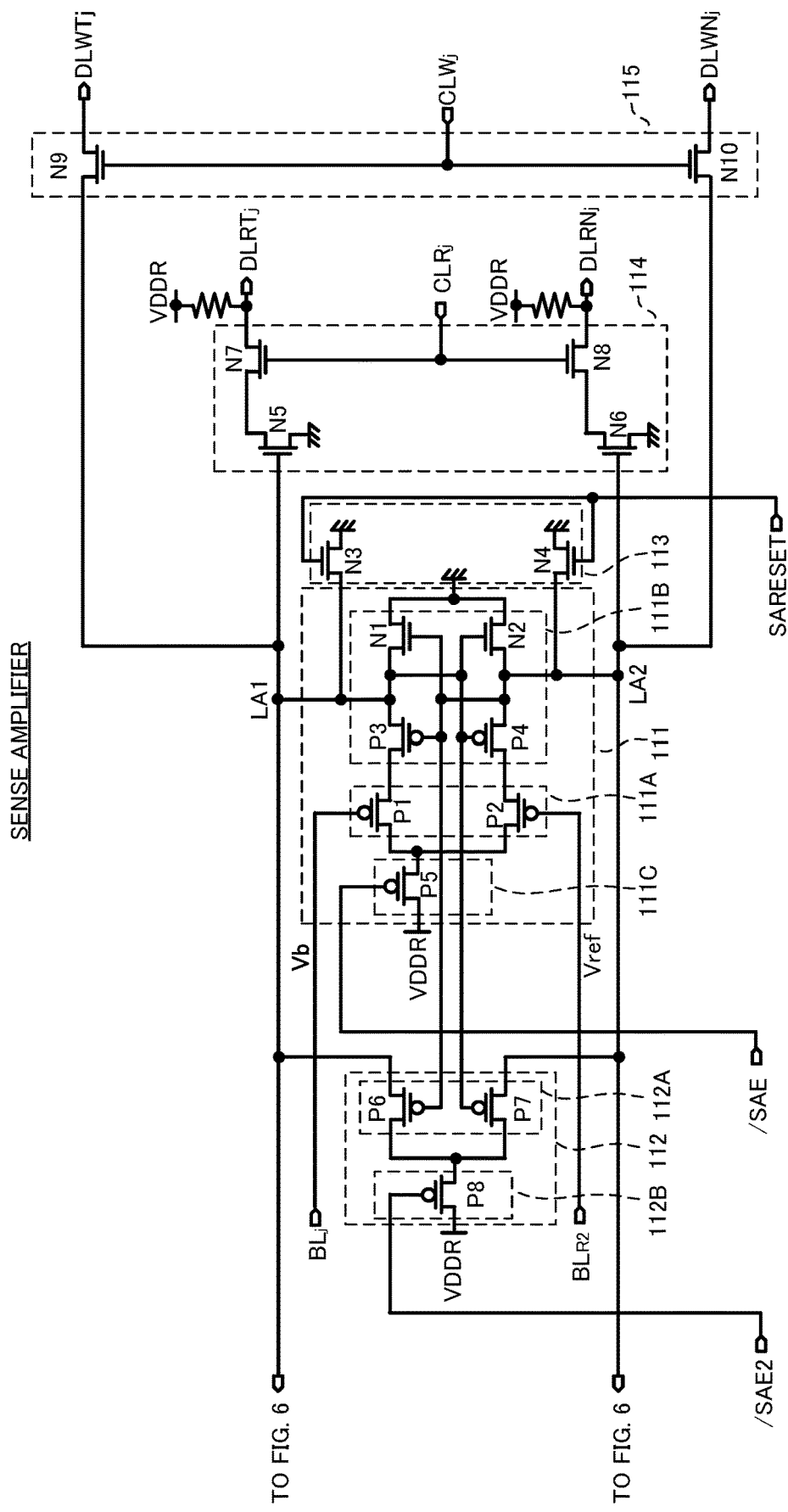
FIG. 5 is a circuit diagram of a sense amplifier included in the RW circuit depicted in FIG. 1.
Figure 6:
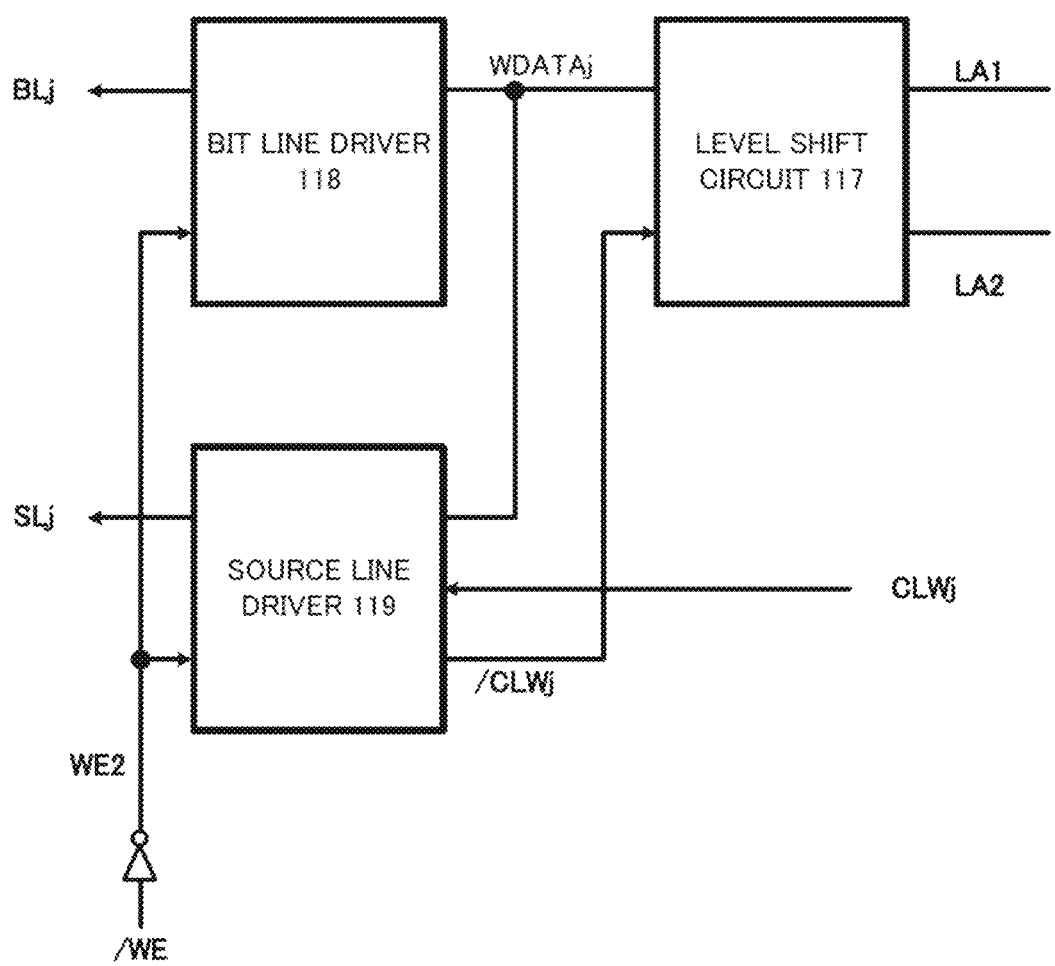
FIG. 6 is a circuit diagram of a write circuit included in the RW circuit depicted in FIG. 1.

The RW circuit 23j includes the sense amplifier illustrated in FIG. 5 and the write circuit illustrated in FIG. 6.

As illustrated in FIG. 5, the sense amplifier includes a latch body 111, an amplification speed acceleration circuit 112, a reset circuit 113, an output circuit 114, and a write input circuit 115. Note that the write input circuit 115 is a part of the write circuit 116 illustrated in FIG. 6.

The latch body 111 includes P-channel MOS transistors (hereinafter, "PMOS transistors") P1 to P5, and NMOS transistors N1 to N2. The latch body 111 functionally includes a gate receiving transistor circuit 111A, a complementary MOS (CMOS) latch 111B, and a latch activation circuit 111C.

The gate receiving transistor circuit 111A includes the PMOS transistors P1 and P2 each of which receives an input signal at a gate terminal thereof. A corresponding bit line BLj is connected to the gate of the PMOS transistor P1, the source of the PMOS transistor P1 is connected to the drain of the PMOS transistor P5, and the drain of the PMOS transistor P1 is connected to the source of the PMOS transistor P3.

The reference voltage Vref is supplied to the gate of the PMOS transistor P2 via the second reference bit line BLR2, the source of the PMOS transistor P2 is connected to the drain of the PMOS transistor P5, and the drain of the PMOS transistor P2 is connected to the source of the PMOS transistor P4.

The CMOS latch 111B includes a CMOS circuit that includes the PMOS transistors P3 and P4, and the NMOS transistors N1 and N2. The drain of the PMOS transistor P3 is connected to the drain of the NMOS transistor N1. The source of the NMOS transistor N1 is grounded. The drain of the PMOS transistor P4 is connected to the drain of the NMOS transistor N2. The source of the NMOS transistor N2 is grounded.

The latch activation circuit 111C includes the PMOS transistor P5. Read voltage VDDR is applied to the source of the PMOS transistor P5, and a sense amplifier enable signal /SAE is applied to the gate of the PMOS transistor P5.

The gate of the PMOS transistor P3 and the gate of the NMOS transistor N1, and the connection node between the PMOS transistor P4 and the NMOS transistor N2 are connected to each other.

The gate of the PMOS transistor P4 and the gate of the NMOS transistor N2, and the connection node between the PMOS transistor P3 and the NMOS transistor N1 are connected to each other.

The amplification speed acceleration circuit 112 includes PMOS transistors P6 to P8, and functionally includes a PMOS latch 112A and a latch activation circuit 112B.

The PMOS latch 112A includes the PMOS transistors P6 and P7 that are of the same conductivity type, and is a second latch for the CMOS latch 111B. The source of the PMOS transistor P6 is connected to the drain of the PMOS transistor P8, and the gate of the PMOS transistor P6 is connected to the gate of the PMOS transistor P3, the gate of the NMOS transistor N1, and the connection node between the PMOS transistor P4 and the NMOS transistor N2.

The source of the PMOS transistor P7 is connected to the drain of the PMOS transistor P8, and the gate of the PMOS transistor P7 is connected to the gate of the PMOS transistor P4, the gate of the NMOS transistor N2, and the connection node between the PMOS transistor P3 and the NMOS transistor N1.

The latch activation circuit 112B includes the PMOS transistor P8, and is a circuit that activates the PMOS latch 112A after a certain amount of time elapses after the start of the amplification operation of the CMOS latch 111B.

The read voltage VDDR is applied to the source of the PMOS transistor P8, and a delay sense amplifier enable signal /SAE2 is applied to the gate of the PMOS transistor P8. Note that the delay sense amplifier enable signal /SAE2 is set to low-level (active level) after a certain amount of time elapses after the sense amplifier enable signal /SAE is set to low level (active level). The delay sense amplifier enable signal /SAE2 is a signal for activating the PMOS latch 112A.

The timing at which the delay sense amplifier enable signal /SAE2 is set to low-level is the timing at which the CMOS latch 111B has amplified the input signal a certain degree (for example, from 30 to 70% of full amplification).

In one example, the delay sense amplifier enable signal /SAE2 is generated by delaying the sense amplifier enable signal /SAE a certain amount of time. Either the read/write controller 33 may generate the delay sense amplifier enable signal /SAE2, or the RW circuit 23 may generate the delay sense amplifier enable signal /SAE2.

The reset circuit 113 includes the NMOS transistors N3 and N4, and resets the sense amplifier.

One end of the current path (source-drain path) of the NMOS transistor N3 is connected to a connection node LA1 between the drain of the PMOS transistor P3 and the drain of the NMOS transistor N1, and the other end of the current path is grounded. One end of the current path of the NMOS transistor N4 is connected to a connection node LA2 between the drain of the PMOS transistor P4 and the drain of the NMOS transistor N2, and the other end of the current path is grounded.

Furthermore, a sense amplifier reset signal SARESET is applied to the gates of the NMOS transistors N3 and N4 The sense amplifier reset signal SARESET is maintained at the high-level at normal times, maintains the sense amplifier SA in the reset state (both of the nodes LA1 and LA2 at the grounded level), and is set to low-level when the sense amplifier operates.

The output circuit 114 includes the NMOS transistors N5 to N8.

The connection node LA1 between the PMOS transistor P3 and the NMOS transistor N1 is connected to the gate of the NMOS transistor N5. One end of the current path of the NMOS transistor N5 is grounded, and the other end of the current path of the NMOS transistor N5 is connected to one end of the current path of the NMOS transistor N7. The other end of the current path of the NMOS transistor N7 is pulled up and outputs output data DLRTj.

The connection node LA2 between the PMOS transistor P4 and the NMOS transistor N2 is connected to the gate of the NMOS transistor N6. One end of the current path of the NMOS transistor N6 is grounded, and the other end of the NMOS transistor N6 is connected to one end of the current path of the NMOS transistor N8. The other end of the current path of the NMOS transistor N8 is pulled up and outputs inverted output data DLRNj. The inverted output data DLRNj corresponds to an inverted signal of the output data DLRTj.

Accordingly, the output data is a pair consisting of data DLRTj and data DLRNj that is complementary thereto.

The read column selection signal CLRj is supplied to the gates of the NMOS transistor N7 and the NMOS transistor N8.

The write input circuit 115 includes a NMOS transistor N9 and a NMOS transistor N10.

Write data is provided via the bus 24 by data DLWTj and data DLWNj that is complementary thereto.

One end of the current path of the NMOS transistor N9 is connected to the connection node LA1, and write data DLWTj is supplied to the other end of the current path of the NMOS transistor N9 from the bus 24. One end of the current path of the NMOS transistor N10 is connected to the connection node LA2, and write data DLWNj is supplied to the other end of the current path of the NMOS transistor N9 from the bus 24. The write data DLWNj corresponds to an inverted signal of the write data DLWTj.

The write column selection signal CLWj is supplied to the gates of the NMOS transistors N9 and N10.

In this example, the bus 24 is provided with two data line pairs for normal data and inverted data that are separately prepared for writing (DLWTj, DLWNj) and reading (DLRTj, DLRNj). The other end of the current path of the NMOS transistor N9 is connected to the DLWTj, the other end of the current path of the NMOS transistor N10 is connected to the DLWNj, the other end of the current path of the NMOS transistor N7 is connected to the DLRTj, and the other end of the current path of the NMOS transistor N8 is connected to the DLRNj.

The write circuit 116 is a circuit that writes data to the memory cell MC and, as illustrated in FIG. 6, includes a level shift circuit 117, a bit line driver 118, and a source line driver 119.

Figure 7:
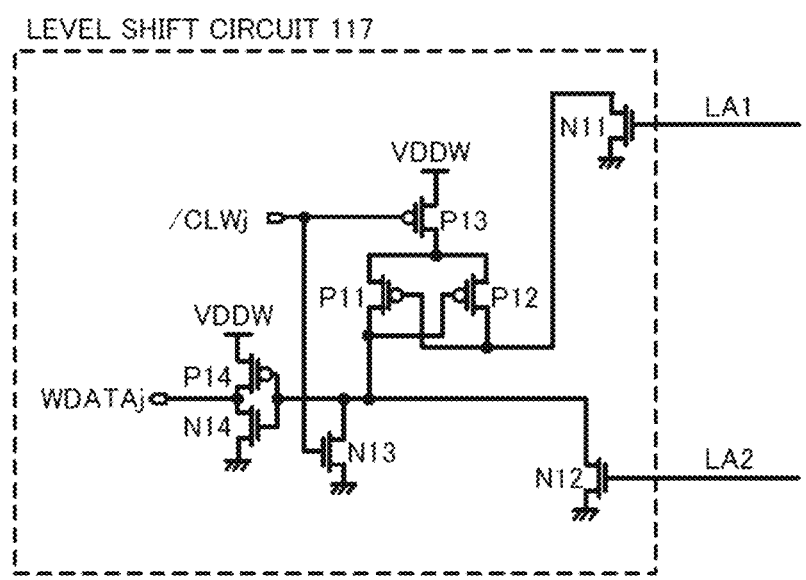
FIG. 7 is a circuit diagram of a level shift circuit depicted in FIG. 6.

As illustrated in FIG. 7, the level shift circuit 117 includes PMOS transistors P11 to P14, and NMOS transistors N11 to N14.

The connection node LA1 illustrated in FIG. 5 is connected to the gate of the NMOS transistor N11 illustrated in FIG. 7. One end of the current path of the NMOS transistor N11 is grounded, and the other end of the NMOS transistor N11 is connected to the gate of the PMOS transistor P11 and one end (the drain) of the current path of the PMOS transistor P12.

The connection node LA2 illustrated in FIG. 5 is connected to the gate of the NMOS transistor N12 illustrated in FIG. 7. One end of the current path of the NMOS transistor N12 is grounded, and the other end of the current path of the NMOS transistor N12 is connected to the gate of the PMOS transistor P12, one end (the drain) of the current path of the PMOS transistor P11, one end (the drain) of the current path of the NMOS transistor N13, and the gates of the PMOS transistor P14 and the NMOS transistor N14 that form a push-pull type inverter. The other end of the current path of the NMOS transistor N12 is grounded.

The sources of the PMOS transistors P11 and P12 are connected to the drain of the PMOS transistor P13, and write voltage VDDW is applied to the sources of the PMOS transistors P13 and P14.

An inverted signal /CLWj of the write column selection signal CLWj is applied to the gates of the PMOS transistor P13 and the NMOS transistor N13. CLWj is a signal that is generated by the source line driver 119 illustrated in FIG. 9.

Figure 8:
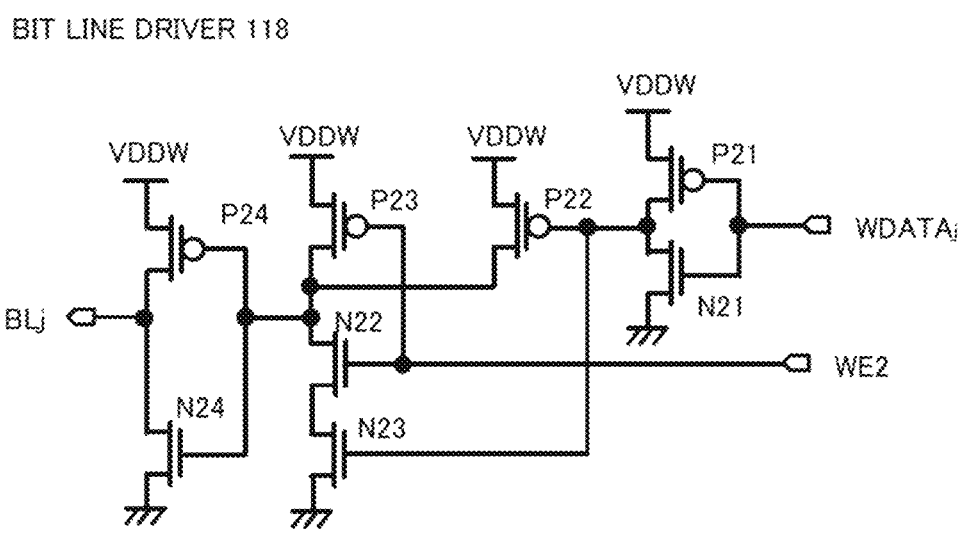
FIG. 8 is a circuit diagram of a bit line driver depicted in FIG. 6.

The bit line driver 118 illustrated in FIG. 8 includes PMOS transistors P21 to P24, and NMOS transistors N21 to N24.

Data WDATAj output from an inverter formed from the PMOS transistor P14 and the NMOS transistor N14 of FIG. 7 is supplied to the gates of the PMOS transistor P21 and the NMOS transistor N21 that form an inverter.

The output of the inverter formed from the PMOS transistor P21 and the NMOS transistor N21 is applied to the gate of the PMOS transistor P22. The write voltage VDDW is applied to the source of the PMOS transistor P22.

The current paths of the PMOS transistor P23 and the NMOS transistors N22 and N23 are connected in series.

The drain of the PMOS transistor P22 is connected to a connection node between the PMOS transistor P23 and the NMOS transistor N22, a write enable signal WE2 is supplied to the gates of the PMOS transistor P23 and the NMOS transistor N22, and the output of the inverter formed from the PMOS transistor P21 and the NMOS transistor N21 is applied to the gate of the NMOS transistor N23. The write enable signal WE2 is set to high-level when writing to the memory cell MC, and is set to low-level when writing is not allowed. The write enable signal WE2 corresponds to an inverted signal of the write enable signal /WE.

When the write enable signal WE2 is high-level, the output of the PMOS transistor P23 and the NMOS transistors N22 and N23 is an inverted output of the output of the inverter formed from the PMOS transistor P21 and the NMOS transistor N21. When the write enable signal WE2 is low-level, the output of the PMOS transistor P23 and the NMOS transistors N22 and N23 is fixed at high-level.

A connection point between the PMOS transistor P23 and the NMOS transistor N22 is supplied to the gates of the PMOS transistor P24 and the NMOS transistor N24 that form an inverter. The output end of the inverter formed from the transistors P24 and N24 is connected to the corresponding bit line BLj.

Figure 9:
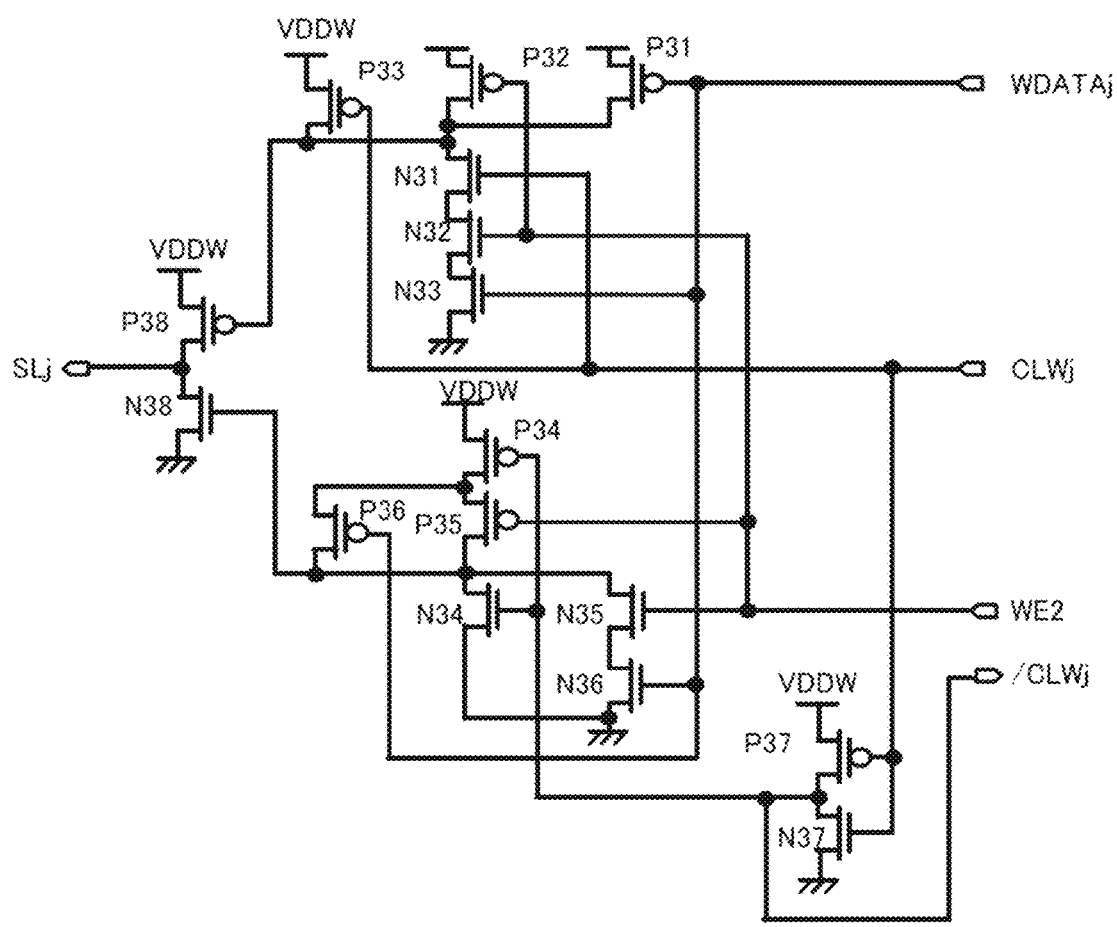
FIG. 9 is a circuit diagram of a source line driver depicted in FIG. 6.

The source line driver 119 illustrated in FIG. 9 includes PMOS transistors P31 to P38, and NMOS transistors N31 to N38.

The data WDATAj generated by the write circuit 116 of FIG. 6 is applied to the gates of the PMOS transistors P31 and P36 and the NMOS transistors N33 and N36.

The write voltage VDDW is applied to the source of the PMOS transistor P31, and the drain of the PMOS transistor P31 is connected to the drains of the PMOS transistors P32 and P33 and the gate of the PMOS transistor P38.

The write voltage VDDW is applied to the source of the PMOS transistor P32, and the currents of the NMOS transistors N31, N32, and N33 are connected in series between the drain of the PMOS transistor P32 and the ground.

The write voltage VDDW is applied to the source of the PMOS transistor P33.

The write voltage VDDW is applied to the source of the PMOS transistor P34, and the drain of the PMOS transistor P34 is grounded via the current paths of the PMOS transistor P35 and the NMOS transistor N34.

The source of the PMOS transistor P36 is connected to the connection node between the drain of the PMOS transistor P34 and the source of the PMOS transistor P35, and the drain of the PMOS transistor P36 is connected to the connection node between the drain of the PMOS transistor N35 and the drain of the NMOS transistor N34.

The write voltage VDDW is applied to the source of the PMOS transistor P37, the drain of the PMOS transistor P37 is connected to the drain of the NMOS transistor N37, and the source of the NMOS transistor N37 is grounded.

The PMOS transistor P38 and the NMOS transistor 38 form a push-pull type inverter, and the output thereof is connected to the corresponding source line SL.

The write column selection signal CLWj is supplied to the gates of the NMOS transistors N31 and N37, and to the gates of the PMOS transistors P33 and P37.

The write enable signal WE2 is supplied to the gates of the NMOS transistors N32 and N35, and to the gates of the PMOS transistors P32 and P35. The write enable signal WE2 is a signal that is set to high-level when the data writing to the memory cell MC is possible.

The output of the inverter formed from the PMOS transistor P37 and the NMOS transistor N37 is connected to the gates of the PMOS transistor P34 and the NMOS transistor N34, and is output as the inverted signal /CLWj of the write column selection signal CLWj.

Next, the operations of the RW circuit 23 that includes the configuration illustrated in FIGS. 5 to 9 is described.

When reading the memory cells MCij of the $j^{th}$ column where the RW circuit 23j is arranged, the read column selection signal CLRj is set to high-level and the NMOS transistors N7 and N8 are turned ON. Next, as illustrated in FIG. 10(a), the sense amplifier reset signal SARESET is set to low-level and the NMOS transistors N3 and N4 are turned OFF.

Figure 10:
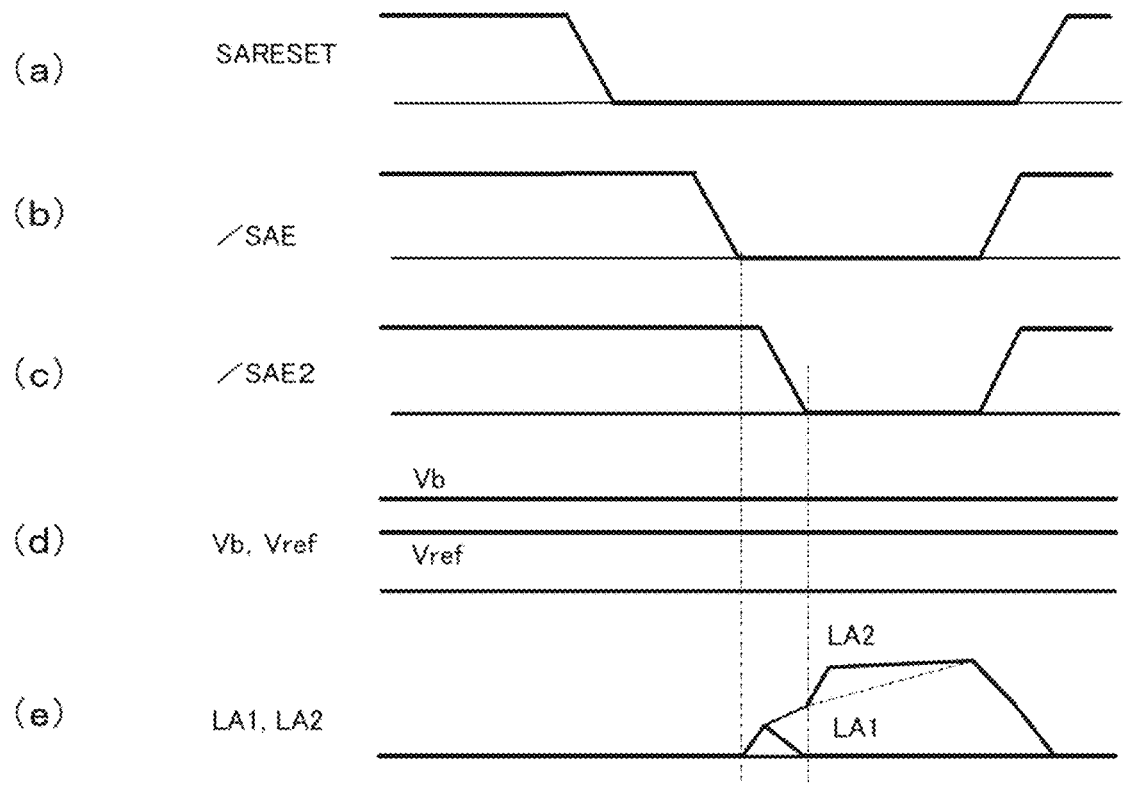
FIGS. 10(a) to 10(e) are a timing chart for explaining the operations of the sense amplifier depicted in FIG. 5.

Then, as illustrated in FIG. 10(b), the sense amplifier enable signal /SAE is set to low-level, and the PMOS transistor P5 that forms the latch activation circuit 111C is turned ON. As a result, the latch body begins driving. Here, as illustrated in FIG. 10(d), it is assumed that the data voltage Vb is supplied from the bit line BLj and the reference voltage Vref is supplied from the second reference bit line BLR2. As illustrated in FIG. 10(e), the differential amplification operation of the latch body causes the voltage of the node LA1 to gradually change to the power supply voltage direction and the voltage of the node LA2 to gradually change to the ground direction.

Next, as illustrated in FIG. 10(c), the delay sense amplifier enable signal /SAE2 is set to low-level. As a result, the PMOS transistor P8 is turned ON, the amplification speed acceleration circuit 112 starts operating, and the PMOS latch 112A differentially amplifies the voltage difference between the nodes LA1 and LA2. That is, the latch body 111 differentially amplifies the data voltage Vb and the reference voltage Vref, and the amplification speed acceleration circuit 112 positively feedback amplifies the voltages of the nodes LA1 and LA2 that correspond to output ends of the latch body 111. As a result, after the delay sense amplifier enable signal /SAE2 changes to low-level, the voltages of the nodes LA1 and LA2 are quickly amplified and fixed, as illustrated in FIG. 10(e).

For example, when Vbj>Vref, after the start of amplification operations, the voltage of the node LA2 becomes greater than the voltage of the node LA1, the voltage of the node LA1 is applied to the gate of the PMOS transistor P4 and the gate of the NMOS transistor N2, and the voltage of the node LA2 is applied to the gate of the PMOS transistor P3 and the gate of the NMOS transistor N1. Accordingly, the level difference is amplified and held. As a result, the NMOS transistor N5 turns OFF and the NMOS transistor N6 turns ON. The output signal DLRT of the NMOS transistor N7 that is turned ON by the read column selection signal CLRj becomes high-level, and the output signal DLRN of the NMOS transistor N8 becomes low-level.

For example, when Vbj<Vref, after the start of amplification operations, the voltage of the node LA1 becomes greater than the voltage of the node LA2, the voltage of the node LA1 is applied to the gate of the PMOS transistor P4 and the gate of the NMOS transistor N2, and the voltage of the node LA2 is applied to the gate of the PMOS transistor P3 and the gate of the NMOS transistor N1. Accordingly, the level difference is amplified and held. As a result, the NMOS transistor N5 turns ON and the NMOS transistor N6 turns OFF. The output signal DLRT of the NMOS transistor N7 that is turned ON by the read column selection signal CLRj becomes low-level, and the output signal DLRN of the NMOS transistor N8 becomes high-level.

Furthermore, with regards to the read voltages of the nodes LA1 and LA2, the voltage levels are converted from the read voltage level to the write voltage level by the level shift circuit 117, and supplied as the data WDATA to the bit line driver 118 and the source line driver 119. For example, when the voltage of the node LA2>the voltage of the node LA1, the data WDATAj becomes high-level, and when the voltage of the node LA1>the voltage of the node LA2, the data WDATAj becomes low-level.

Thus, the read phase ends. When writing the read data back to the memory cell MC, the write enable signal /WE is set to low-level. As a result, the inverted signal thereof, namely the write enable signal WE2, becomes high-level. The level shift circuit 117 outputs the data WDATAj that corresponds to the read data. The bit line driver 118 sets the bit line BLj to a voltage that corresponds to the data WDATAj. For example, if the data WDATAj is high-level, the voltage of the bit line BLj is set to low-level and, if the data WDATAj is low-level, the voltage of the bit line BLj is set to high-level.

Meanwhile, the source line driver 119 sets the voltage of the source line SLj to a voltage that corresponds to the data WDATAj. For example, if the data WDATAj is high-level, the voltage of the source line SLj is set to high-level and, if the data WDATAj is low-level, the voltage of the source line SLj is set to low-level.

As a result, when the data "1" is stored in the memory cell MCij, Vbj>Vref→node LA1<node LA2→WDATAj=high-level→bit line BLj=low-level and source line SLj=high-level, and current flows from the pin layer MP to the free layer MF of the memory cell MCij, and "1" is written to the memory cell MCij. When the data "0" is stored in the memory cell MCij, Vbj<Vref→node LA1>node LA2→WDATAj=low-level→bit line BLj=high-level and source line SLj=low-level, and current flows from the free layer MF to the pin layer MP of the memory cell MCij, and "0" is written. As a result, it is possible to prevent the occurrence of read disturbances.

Next, a write operation is described.
When writing data, the write column selection signal CLWj becomes high-level and, as a result, the NMOS transistors N9 and N10 turn ON.

Write data such that DLWT<DLWN when the data "1" is to be written and DLWT>DLWN when the data "0" is to be written is supplied via the bus.

Since the NMOS transistors N9 and N10 are turned ON, the voltages of the nodes LA1 and LA2 are set by the write data DLWT and DLWN supplied from the bus 24. Thereafter, data is written to the memory cells via the same operations as when writing back. Specifically, when the write data is "1", that is, when DLWT<DLWN, the bit line BLj is low-level, the source line SLj is high-level, the write current I flows from the pin layer MP to the free layer MF of the memory cell MCij, and "1" is written. Meanwhile, when the write data is "0", that is, when DLWT>DLWN, the bit line BLj is high-level, the source line SLj is low-level, the write current I flows from the free layer MF to the pin layer MP of the memory cell MCij, and "0" is written.

The sense amplifier configured as illustrated in FIG. 5 includes a configuration in which the gates of the PMOS transistors P1 and P2 of the gate receiving transistor circuit 111A are connected to the bit line BLj and the reference bit line BLR. In this configuration, voltage instead of current may be applied to the sense amplifier and, as such, current for the number of sense amplifiers is not necessary and a power-saving storage circuit can be realized.

Figure 13:
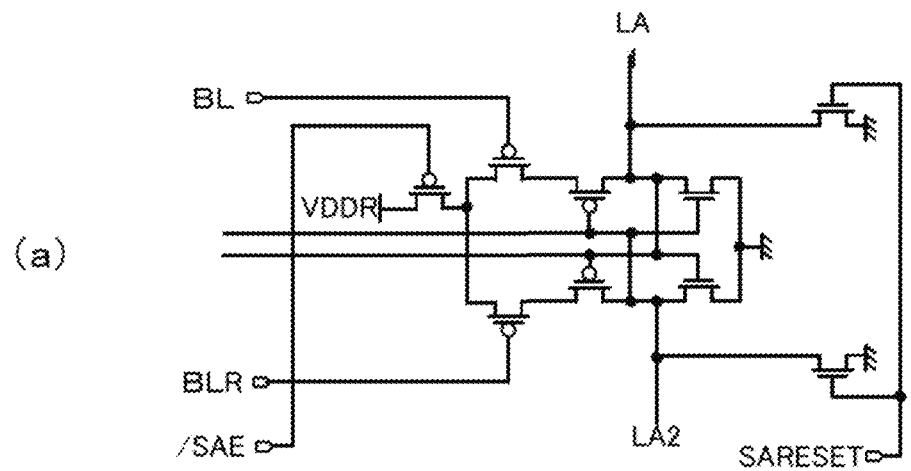
FIG. 13(a) is a circuit diagram illustrating a configuration example of a sense amplifier that does not include an amplification acceleration circuit.
FIG. 13(b) shows simulated waveforms of a read operation of the sense amplifier depicted in FIG. 13(a)
FIG. 13(c) shows simulated waveforms of the sense amplifier of the embodiment.
Figure 13:
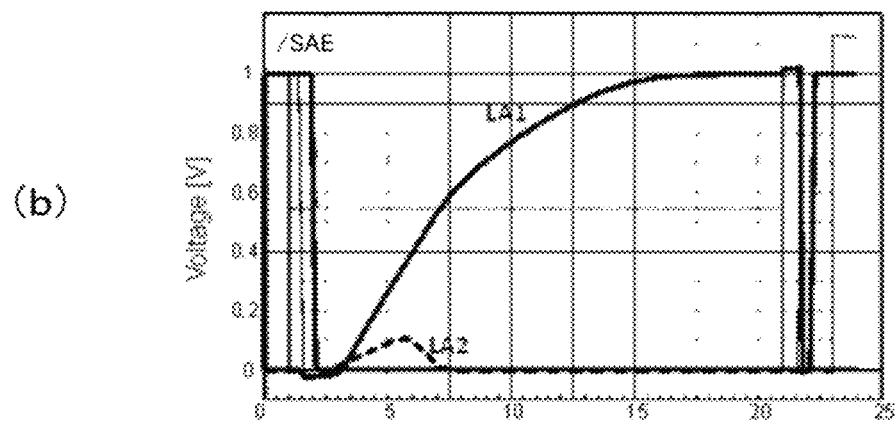
Figure 13:
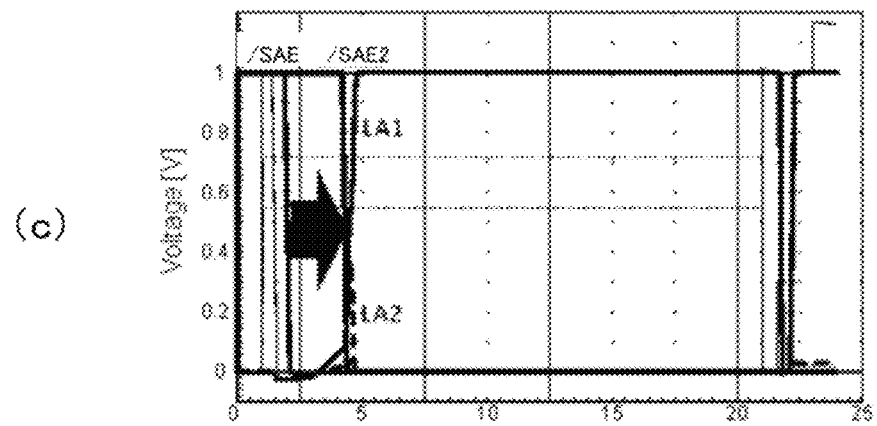

In contrast, with, for example, common circuit configurations such as that of the sense amplifier 25 of FIG. 13 of Patent Literature 2, the bit line is connected to the drain or the source of the transistor that forms the sense amplifier. However, as described above, with such a circuit configuration, all of the resistances and capacitances on the bit lines and the reference lines become loads on the latch circuit. Consequently, time is required to drive the load. However, with the configuration illustrated in FIG. 5, the bit line and the reference bit line are connected to the gates of MOS transistors. As a result, the load on the CMOS latch 111B becomes an internal node of the latch body 111, the load is reduced, and increased speed can be obtained.

Figure 11:
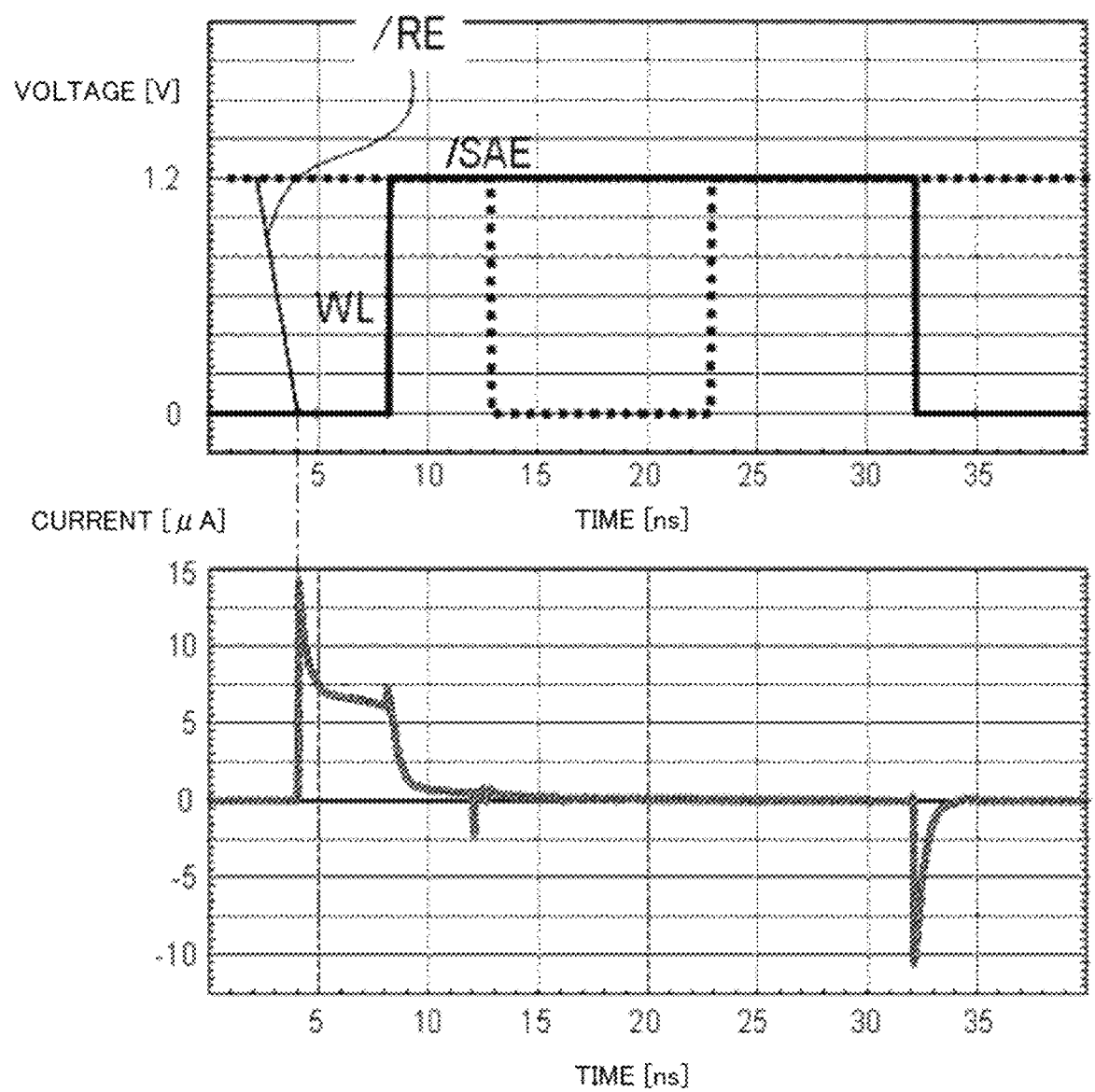
FIG. 11 shows simulated waveforms for explaining the operating current of the sense amplifier.

FIG. 11 illustrates simulation results of the operating current of the sense amplifier of the present embodiment.

The simulation results illustrated in FIG. 11 are from an example in which the number of columns is 256 and, in a steady state, an average current of 0.8 μA is sufficient. In contrast, the operating current of a conventional sense amplifier is about 10 mA (=10,000 μA) Therefore, it is possible to reduce the operating current by about 10 mA.

Next, a detailed description of FIG. 11 is given. The channel width and bit line width of the transistors that form the CMOS latch of the sense amplifier are set to values typical of the 40 nm CMOS generation, and each memory cell includes one MTJ and one NMOS transistor. As illustrated in FIG. 11, current flows from the power supply to the ground at the point in time when the read enable signal /RE is low-level and pre-charging of the bit line BLj by the read voltage VR has started. However, when the voltage of the word line WLi is high-level, the current decrease rapidly, becomes steady state at the point in time when the sense amplifier enable signal /SAE becomes low-level (active) and, in this simulation, a current of merely 0.8 μA flows.

Figure 12:
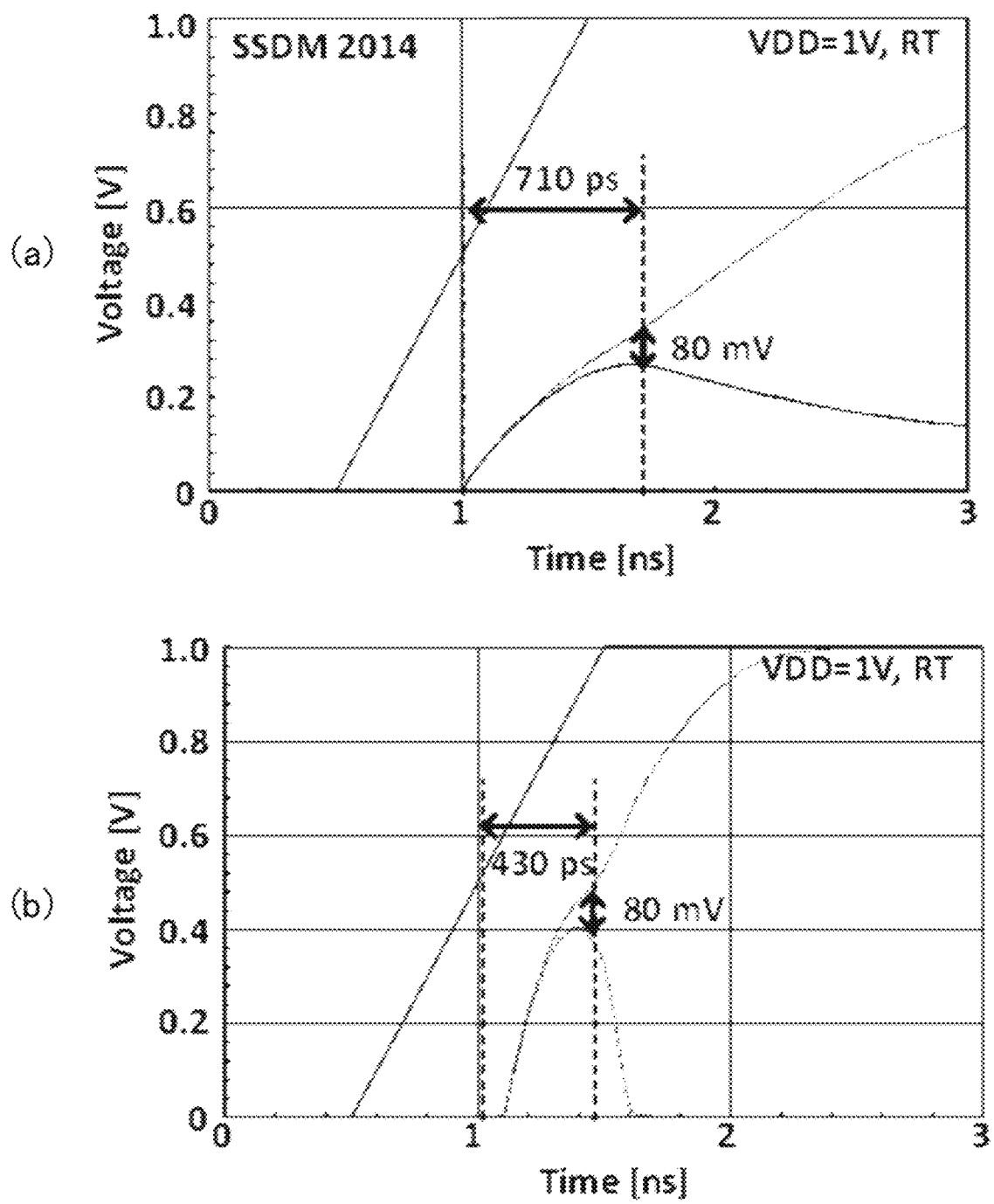
FIG. 12(a) shows simulated waveforms for explaining the operating speed of the sense amplifier, and depicts an example of a sense amplifier in which the bit lines are connected to the drain.
FIG. 12(b) shows simulated waveforms for explaining the operating speed of the sense amplifier, and depicts an example of the sense amplifier of the embodiment.

Next, FIG. 12 illustrates a comparison example of the operating speeds of the sense amplifier of the present embodiment with a conventional sense amplifier that has the typical configuration disclosed in FIG. 13 of Patent Literature 2 in which the bit line is received at the drain.

FIG. 12 illustrates the time from the start of sensing to when the difference of the output of the sense amplifier between when the data output is 0 and 1 is 80 mV. FIG. 12(*a*) illustrates an example of the detection speed of a conventional sense amplifier in which the bit line is connected to the drain. FIG. 12(*b*) illustrates the detection speed of the sense amplifier of the present embodiment. Note that the channel width and bit line width of the transistors that form the CMOS latch are set to values typical of the 40 nm CMOS generation, and each memory cell includes one MTJ and one NMOS transistor. As illustrated in the drawings, the sensing time is shortened from 710 ps to 430 ps, which confirms the effectiveness of the configuration of the present embodiment in which the bit line is connected to the gate of the PMOS transistor.

Even if the input end of the sense amplifier is the gate of a MOS transistor, two types are conceivable, namely the gate of a PMOS transistor and the gate of an NMOS transistor.

For example, in a case in which the gate of an NMOS transistor is the input end, when the voltage of the bit line BL is output to the NMOS gate terminal that forms the input end at the time of the amplification operation of the CMOS latch, operations are required in which, first, each node in the CMOS latch is pre-charged by the power supply voltage, then, the latch amplification operation is started by the sense amplifier activation signal, and the node LA1 or LA2 is pulled to the ground.

In contrast, with the sense amplifier that has the configuration illustrated in FIG. 5, when the data voltage Vb is output to the gate of the PMOS transistor P1 and the reference voltage Vref is output to the gate of the PMOS transistor P2 and, then, the sense amplifier enable signal /SAE becomes high-level, the CMOS latch 111B immediately starts the amplification and latching amplification and pulls up the voltage of the node LA1 or LA2 to the power supply voltage side. As a result, it is possible to increase the operating speed.

The sense amplifier of FIG. 5 includes the amplification speed acceleration circuit 112. In a case in which the amplification speed acceleration circuit 112 is not provided, when the voltage between the gate and the source of the PMOS transistors P1 and P2 decreases at the time of the sensing amplification operation (in particular, when high-level voltage is read to the bit line BL), the current between the source and the drain of the PMOS transistors P1 and P2 decreases, the charging of the nodes LA1 and LA2 takes time, and the pull up time of the voltage of the nodes LA1 and LA2 increases.

In contrast, in the circuit configuration of FIG. 5, when the amplification by the CMOS latch 111B has progressed a certain degree, the delay sense amplifier enable signal /SAE2 becomes low-level and the amplification speed acceleration circuit 112 is activated. Components corresponding to the PMOS transistors P1 and P2 are not disposed in the amplification speed acceleration circuit 112. As such, the nodes LA1 and LA2 can be charged at high-speed without being affected by current reductions due to insufficient voltage between the source and the drain.

FIG. 13(a) is a circuit example of a sense amplifier according to a comparative example that does not include an amplification speed acceleration circuit. FIG. 13(b) illustrates the operating speed of the sense amplifier depicted in FIG. 13(a), and FIG. 13(c) illustrates the operating speed of the sense amplifier depicted in FIG. 5. As illustrated in the drawings, it is confirmed that, with the sense amplifier of the present embodiment, high-speed reading is enabled due to the effects of the amplification speed acceleration circuit 112.

The present disclosure is not limited to the embodiment described above, and various modifications and uses are possible.

For example, the signal sequence at the time of the read operation can be appropriately changed.

Figure 14:
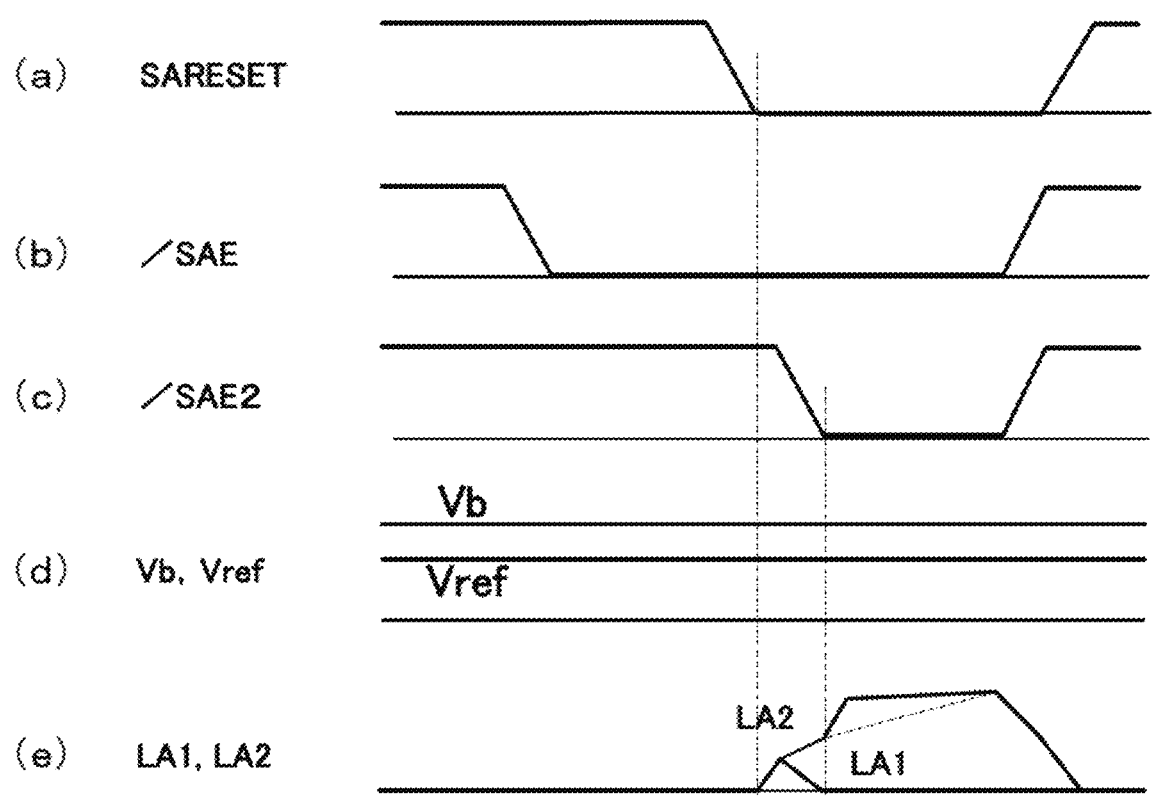
FIGS. 14(a) to 14(e) are a timing chart for explaining a modified example of the operations of the sense amplifier.

For example, typically, an order is used in which first, the sense amplifier reset signal SARESET falls (reset cancellation) and, then, the sense amplifier enable signal /SAE falls (amplifier activation). However, as illustrated in FIGS. 14(a) and 14(b), an order may be used in which, the sense amplifier enable signal /SAE falls and, then, the sense amplifier reset signal SARESET falls.

Note that either of the rise of the sense amplifier reset signal SARESET and the rise of the sense amplifier enable signal /SAE may be occur first, or, both may occur at the same time.

The various circuits are not limited to the configurations described in the embodiment and, provided that the same functions can be realized, the various circuits can be appropriately modified.

Figure 15:
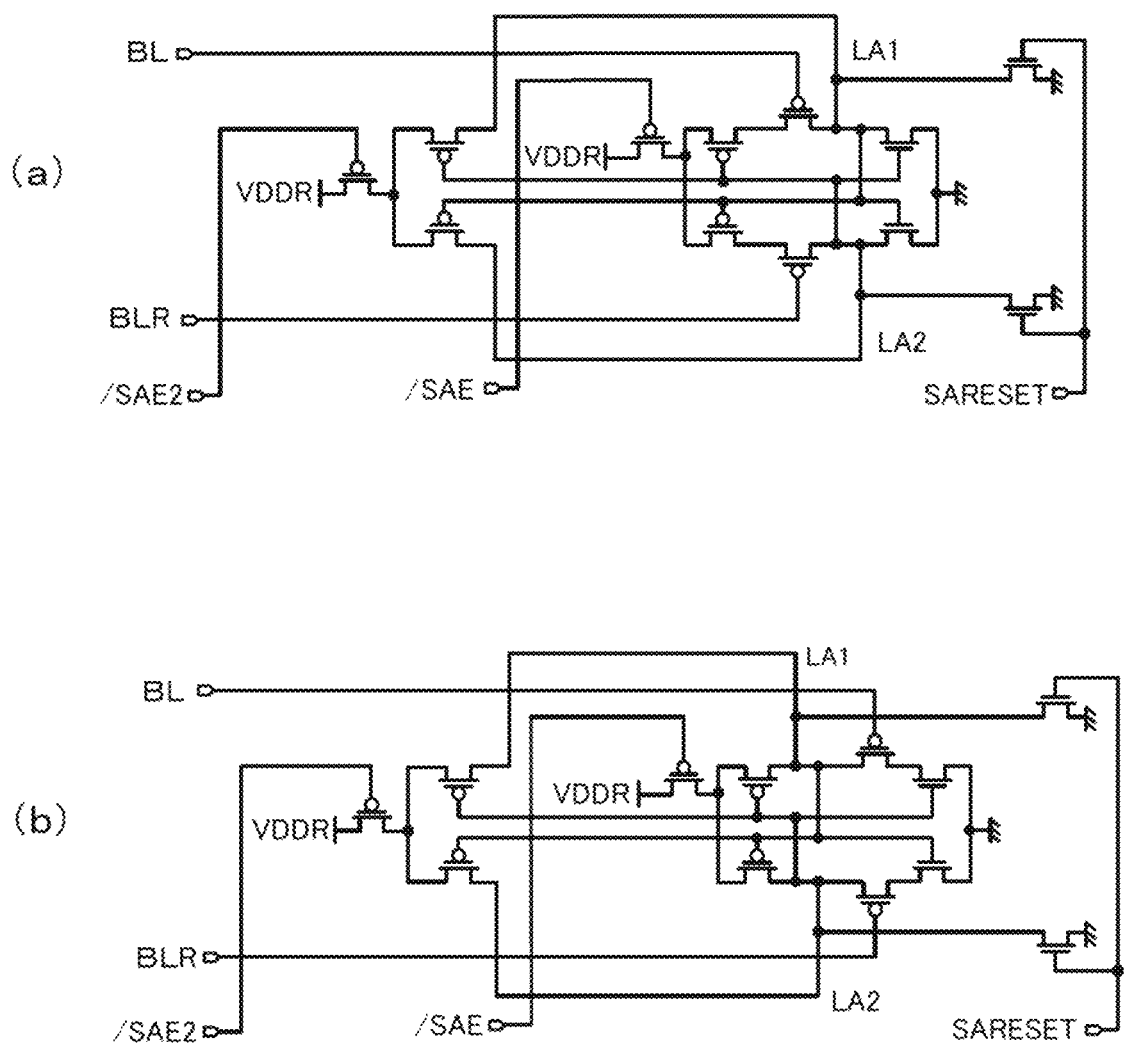
FIGS. 15(a) and 15(b) are circuit diagrams of a sense amplifier according to a modified example.

For example, as illustrated in FIGS. 15(a) and 15(b), the arrangement of the various functional components of the circuit depicted in FIG. 5 may be modified.

Additionally, any configuration may be used for the level shift circuit 117 illustrated in FIG. 7, provided that the level shift circuit 117 can shift the signal level from the read voltage level to the write voltage level.

Any configurations may be used for the bit line driver 118 and the source line driver 119 illustrated in FIGS. 8 and 9, provided that, when the write enable signal WE2 and the write column selection signal CLWj are active, write voltage corresponding to the data WDATAj is applied to the bit line BLj and the source line SLj, and when the write enable signal WE2 or the write column selection signal CLWj is inactive, the voltage difference between the bit line BLj and the source line SLj can be set to less than or equal to the voltage at which the threshold current for writing to the memory cell flows.

Figure 16:
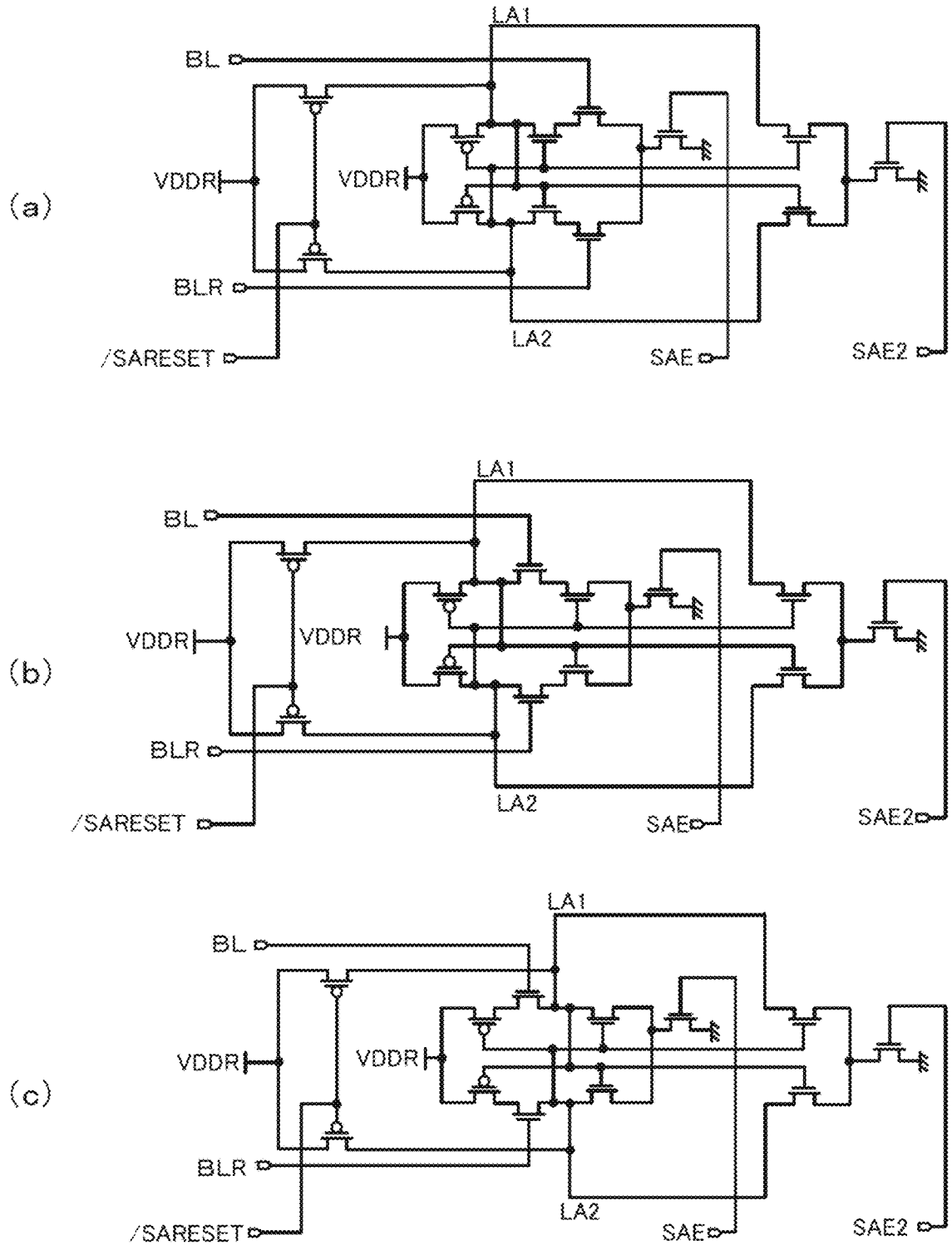
FIGS. 16(a) to 16(c) are circuit diagrams of a sense amplifier according to another modified example.
Figure 17:
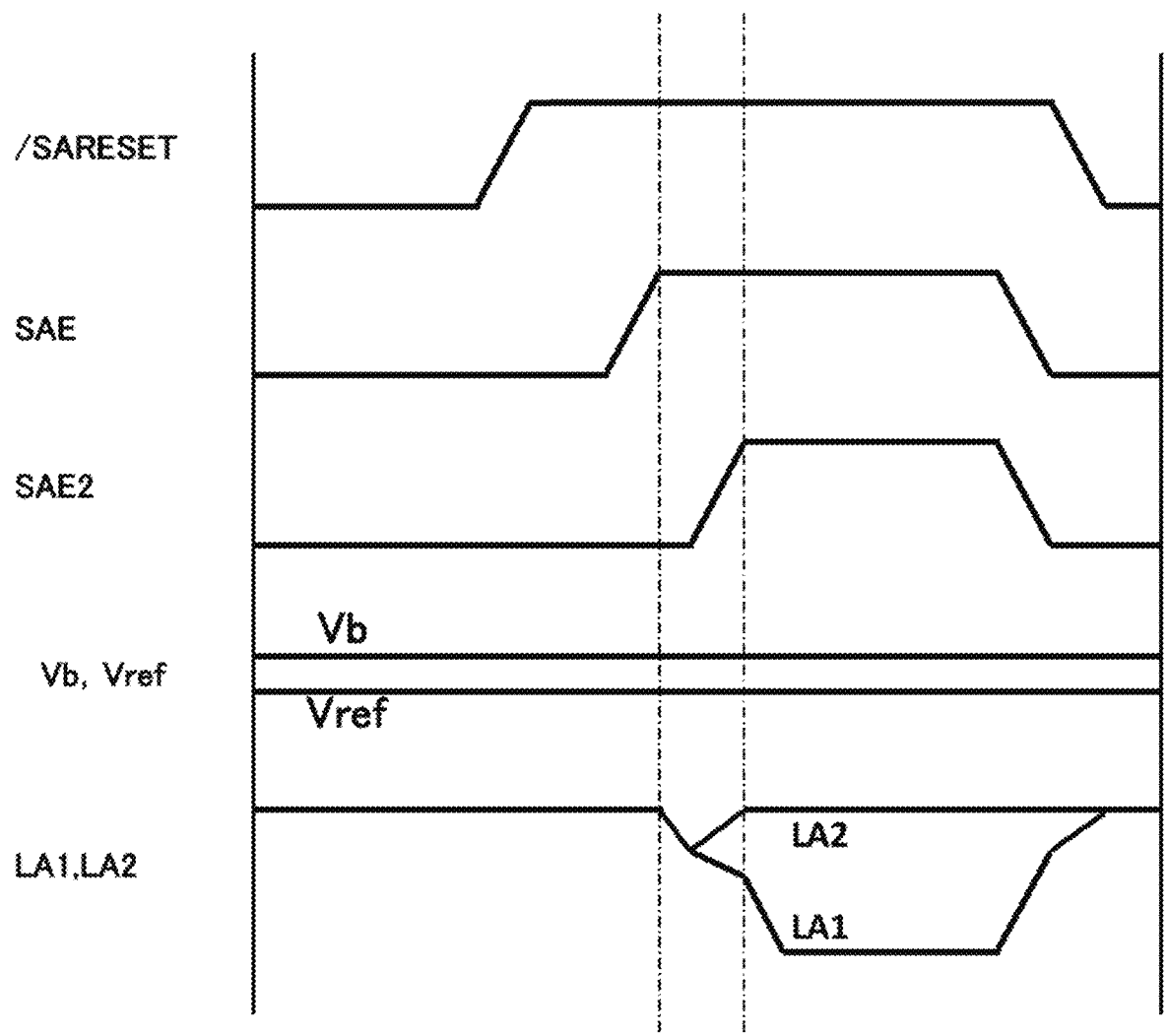
FIG. 17 is a timing chart for explaining the operations of the sense amplifier depicted in FIGS. 16(a) to 16(c)

From the perspective of increasing the speed, it is preferable that a PMOS transistor is used as the gate receiving circuit. However, the gate receiving circuit can be realized by an NMOS transistor or the circuits illustrated in FIGS. 16A to 16C. In such a case, the timing charge is, for example, as illustrated in FIG. 17.

Fundamentally, the phases of the sense amplifier reset signal SARESETB, the sense amplifier enable signal /SAE, and the delay sense amplifier enable signal /SAE2 are the opposite those of when a PMOS configuration is used.

Note that either of the rise of the sense amplifier reset signal SARESETB and the rise of the sense amplifier enable signal /SAE may occur first, or, both may occur at the same time. Either of the fall of the sense amplifier reset signal SARESETB and the fall of the sense amplifier enable signal /SAE may be performed first, or, both may be performed at the same time.

For example, in the embodiment described above, a common fixed resistor FR is arranged for the plurality of reference cells RCj, but it is possible to configure a fixed resistor FR and an MTJ element set to the low-resistance state as one reference cell RCj.

It is also possible to arrange the fixed resistor FR inserted on the first reference bit line BLR1 on the reference source line SLR.

In the embodiment described above, in the read operation, the storage data of the all of the memory cells MC of the selected row is read and determined in parallel. However, the present disclosure is not limited to this embodiment and a configuration is possible in which only a memory cell specified by the row address and the column address is read-accessed, the data voltage Vb is read, and the storage data is determined.

In the embodiment described above, an example is described in which the read data is automatically written back after the completion of the read operation. However, a configuration is possible in which whether to write back and the memory cell, the row, the column, or the like to be written back to are specified. In such a case, a signal that instructs the enable/disable of the write back may be supplied to each sense amplifier SA, and the write back function may be turned ON/OFF on the basis of this signal.

In the embodiment described above, the data "0" is assigned to the low resistance of the MTJ element and the data "1" is assigned to the high resistance of the MTJ element. However, a configuration is possible in which the data "1" is assigned to the low resistance of the MTJ element and the data "0" is assigned to the high resistance of the MTJ element.

In the configuration of FIG. 1, the selection transistors STij are arranged more to the source line SLi side than the memory cells MCij, but any arrangement order may be used. Likewise, in the configuration of FIG. 1, the selection transistors ATi are arranged more to the reference source line SLR side than the reference cells RCi, but any arrangement order may be used.

Figure 18:
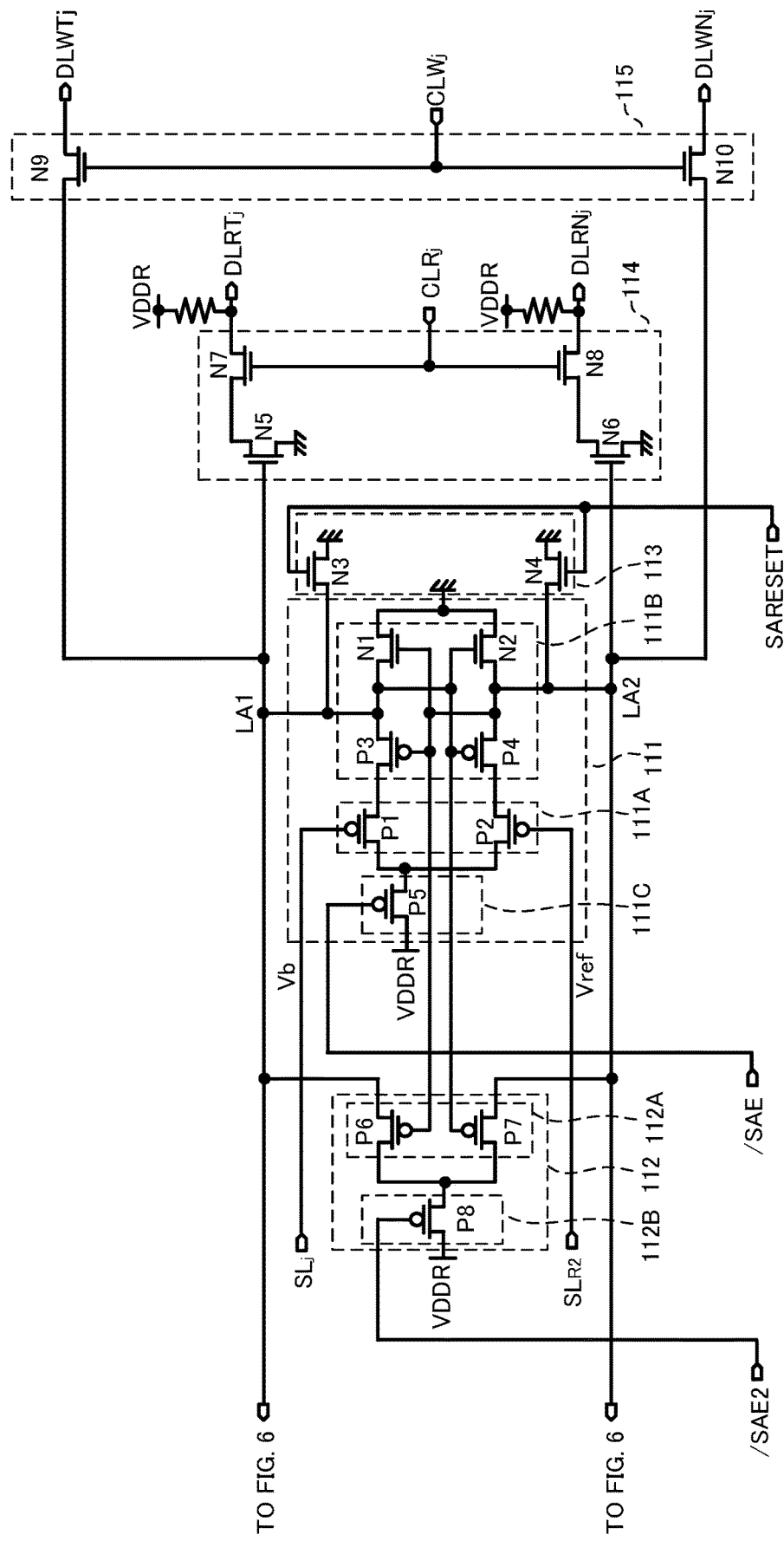
FIG. 18 is a circuit diagram of a sense amplifier according to a modified example.
Figure 19:
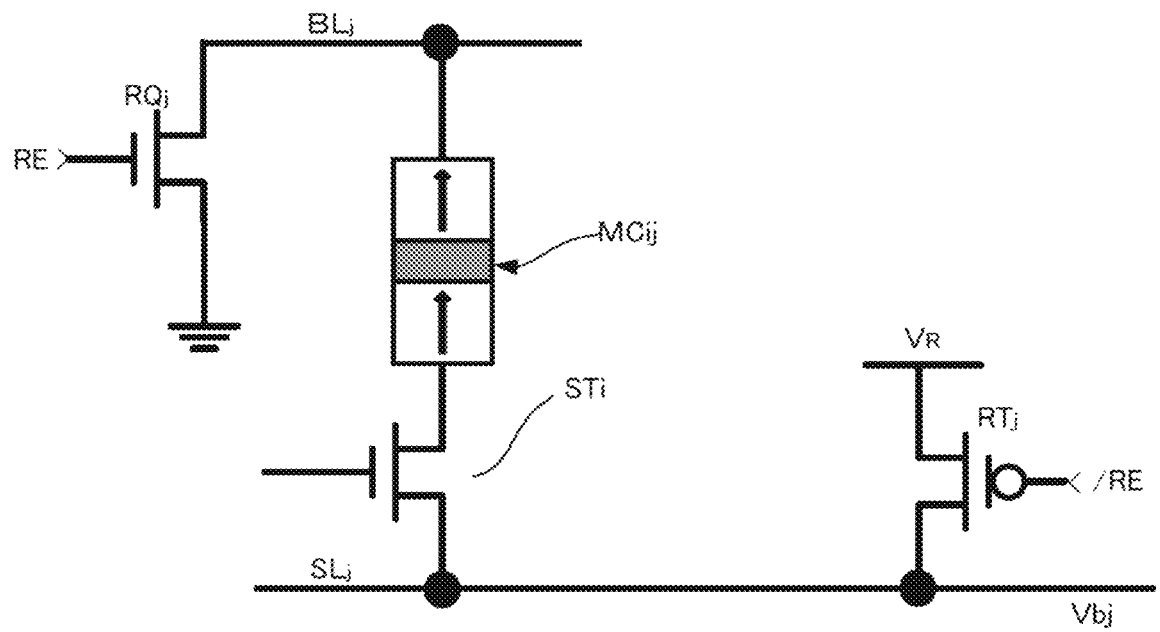
FIG. 19 is a drawing for explaining the circuit configuration of a storage circuit according to a modified example.
Figure 19:
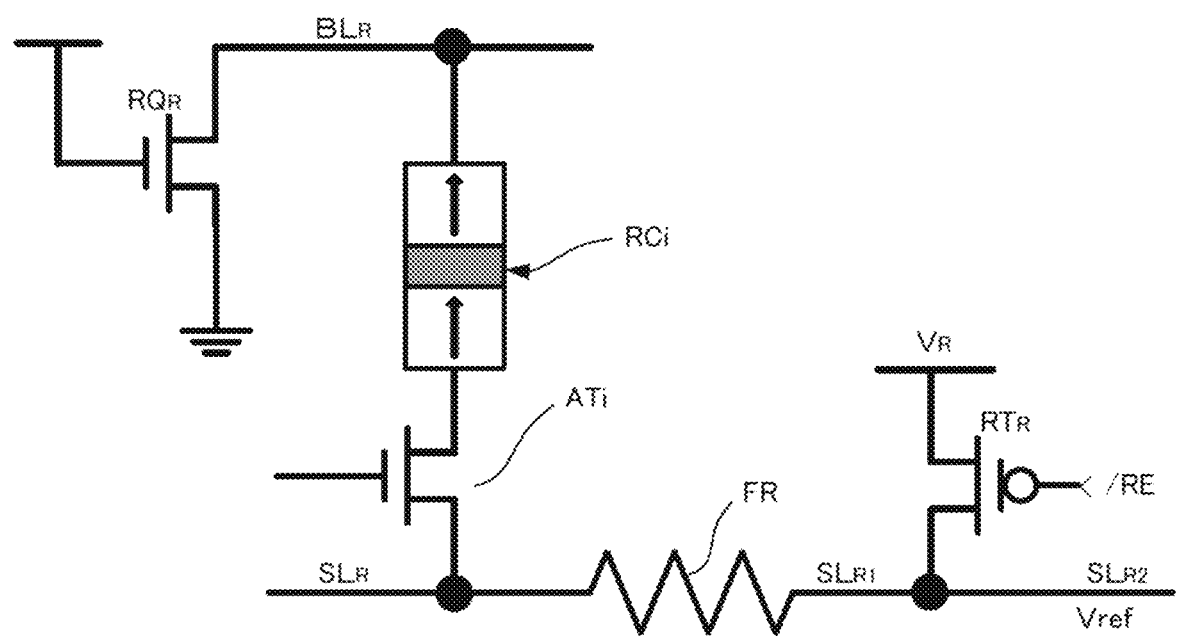

In the embodiment described above, a circuit configuration is described in which the read voltage signal is generated on the bit line BLj, and the bit line BLj is connected to the input end of the sense amplifier (the gate terminal of PMOS transistor P1 of FIG. 5). However, the present disclosure is not limited thereto, and a circuit configuration is possible in which the read voltage signal is generated on the source line SLj and, as illustrated in FIG. 19, the source line SLj is connected to the input end of the sense amplifier (the gate terminal of the PMOS transistor P1 of FIG. 18). In this case, as illustrated in FIG. 17, the drain of the load transistor RTj is connected to the source line SLj instead of the bit line BLj, and the drain of the grounding NMOS transistor RQj is connected to the bit line BLj instead of the source line SLj.

Additionally, the fixed resistor FR is inserted on the reference source line SLR, the drain of the reference load transistor RTR is connected to the connection node between the reference source lines SLR1 and SLR2 instead of the reference bit line BLR, and the drain of the grounding NMOS transistor RQR is connected to the reference bit line BLR instead of the reference source line SR. As illustrated in FIG. 16, the reference source line SLR2 is connected to the gate of the PMOS transistor P2 of the sense amplifier circuit.

Additionally, the storage element to which the write data is written is not limited to an MTJ element, and any variable resistance storage element such as resistance random access memory (ReRAM) can be used. In this case as well, the variable resistance element forming the reference circuit is provided with the same configuration as the variable resistance element that forms the memory cell and is set to the low resistance RL and, furthermore, the resistance value of the fixed resistor FR is set greater than 0 and less than the difference between the high resistance RH and the low resistance RL of the variable resistance element. In particular, it is preferable that the resistance value is substantially equal to $(\alpha/100) \times RL$. Here, $\alpha$ is a resistance value variation upper limit value (%) of the variable resistance element allowed based on the resolution (minimum value at which the difference between the voltage of the positive input terminal and the voltage of the negative input terminal can be detected) of the sense amplifier used in the storage circuit. In this case as well, a configuration is possible in which a fixed resistor is arranged for each reference cell, and a configuration is possible in which one fixed resistor is arranged (shared) for a plurality of reference cells (variable resistance elements).

The present disclosure is not limited by the foregoing descriptions of the embodiments and drawings, and various modifications and the like may be made to the embodiments and the drawings.

This application claims the benefit of Japanese Patent Application No. 2017-236524, filed on Dec. 8, 2017, International Publication No. WO 2016/186086, and International Publication No. WO 2015/083754, of which the entirety of the disclosures are incorporated by reference herein.

The foregoing describes some example embodiments for explanatory purposes. Although the foregoing discussion has presented specific embodiments, persons skilled in the art will recognize that changes may be made in form and detail without departing from the broader spirit and scope of the invention. Accordingly, the specification and drawings are to be regarded in an illustrative rather than a restrictive sense. This detailed description, therefore, is not to be taken in a limiting sense, and the scope of the invention is defined only by the included claims, along with the full range of equivalents to which such claims are entitled.

REFERENCE SIGNS LIST

11 Storage circuit
21 Memory cell array
22 Reference cell array
31 Row decoder
32 Column decoder
33 Read/write controller
111 Latch body
111A Gate receiving transistor circuit
111B CMOS latch
111C Latch activation circuit
112 Amplification speed acceleration circuit
112A PMOS latch
112B Latch activation circuit
113 Reset circuit
114 Output circuit
115 Write input circuit
116 Write circuit
117 Level shift circuit
118 Bit line driver
119 Source line driver
CLR Read column selection signal
CLW Write column selection signal
WL1 to WLm Word line
BL1 to BLn Bit line
BLR Reference bit line
BLR1 First reference bit line
BLR2 Second reference bit line
ST11 to STmn Selection transistor
ATR Selection transistor
SL1 to SLn Source line
SLR Reference source line
RT1 to RTn Load transistor
RTR Reference load transistor
RQ1 to RQn, RQR Grounding NMOS transistor
Vb Data voltage
Vref Reference voltage

The invention claimed is:

1. A sense amplifier for reading data stored in memory cells of a storage circuit that includes: the memory cells that each include a variable resistance element; a resistance voltage conversion circuit that converts resistance values of the memory cells to data voltages; and a reference circuit that generates a reference voltage for determining a level of each of the data voltages, the sense amplifier comprising:
a pair of metal-oxide-semiconductor (MOS) field-effect (FET) transistors of a same conductivity type, one MOS FET transistor receiving, at a gate thereof, another MOS FET transistor receiving, at a gate thereof, the reference voltage output from the storage circuit;
a complementary MOS (CMOS) latch that is connected to current paths of the pair of MOS FET transistors, includes a CMOS circuit, and amplifies and latches a difference between the data voltages and the reference voltage;
a second latch that amplifies and latches output of the CMOS latch; and
an activation circuit which activates the second latch after a certain amount of time elapses after a start of an amplification operation of the CMOS latch,
wherein the certain amount of time is a time period during which the CMOS latch amplified an input signal by 30 to 70% of full amplification.

2. The sense amplifier according to claim 1, wherein the pair of MOS FET transistors of the same conductivity type includes P-channel MOS FET transistors.

3. The sense amplifier according to claim 1, wherein
the memory cells are arranged in a matrix of m rows and n columns, where m and n are positive integers and m and n are 2 or greater,
the resistance voltage conversion circuit is arranged in each column of the memory cells, and converts a resistance value of a memory cell to be read to a data voltage,
the reference circuit includes
reference cells that have a same configuration as the variable resistance elements of the memory cells, and that are arranged in m rows and one column,
a fixed resistor connected to the reference cells in series, and
a reference voltage conversion circuit that includes a configuration substantially identical to the resistance voltage conversion circuit, and that converts a resistance value of a combined resistance of the reference cells to be accessed and the fixed resistor to a reference voltage, and the sense amplifier is arranged in each column of the memory cells, and determines data stored in the memory cells by comparing the data voltage output from the resistance voltage conversion circuit of a corresponding column with the reference voltage provided from the reference circuit.

4. The sense amplifier according to claim 3, wherein the resistance voltage conversion circuit includes
a bit line connected to memory cells of a same column,
a load transistor connected to the bit line, and
means for selecting a memory cell to be accessed, and
the reference voltage conversion circuit includes
a reference bit line connected to the reference cells,
a reference load transistor connected to the reference bit line, and
means for selecting a reference cell at a position apart from the reference load transistor by a distance that corresponds to a distance from a memory cell to be accessed to the load transistor, and
the sense amplifiers compare the data voltage of the respective bit line with a reference voltage of the reference bit line.

5. The sense amplifier according to claim 1, wherein
the gate of the one MOS FET transistor of the pair MOS FET transistors of a same conductivity type is connected to the output node of the resistance voltage conversion circuit, and
the gate of the another MOS FET transistor of the pair of MOS FET transistors of a same conductivity type is connected to the output node of the reference circuit.

6. A storage circuit comprising:
memory cells each including a variable resistance element, the memory cells being arranged in a matrix of m rows and n columns, where m and n are positive integers equal to or greater than two;
n resistance voltage conversion circuits each of which is arranged in a respective column of the memory cells, and that converts a resistance value of a memory cell to be read to a data voltage;
a reference circuit that includes m reference cells arranged in a matrix of m rows and one column, each of the m reference cells including a variable resistance element having a same configuration as the variable resistance element of each of the memory cells, and one fixed resistor commonly connected to the m reference cells in series, or m fixed resistors each connected to respective one of the m reference cells in series, the variable resistance elements of the reference cells being set to low resistance;
a reference voltage conversion circuit that converts a resistance value of a series circuit of one of the reference cells to be read and the fixed resistor to a reference voltage; and
n sense amplifiers each of which is arranged in respective columns, and determines data stored in the memory cells by comparing the reference voltage with the data voltage output from the resistance voltage conversion circuit of a corresponding column;
the reference voltage conversion circuit including a reference bit line which extends across at least one of n columns and supplies the reference voltage to the n sense amplifiers,
wherein the reference bit line includes:
a first reference bit line connected to the reference cells; and
a second reference bit line which connected to the first reference bit line, extends across the at least one of n columns, and has an area of cross section greater than an area of cross section of the first reference bit line.

7. A storage circuit comprising:
memory cells each including a variable resistance element, the memory cells being arranged in a matrix of m rows and n columns, where m and n are positive integers equal to or greater than two;
n resistance voltage conversion circuits each of which is arranged in a respective column of the memory cells, and that converts a resistance value of a memory cell to be read to a data voltage;
a reference circuit that includes m reference cells arranged in a matrix of m rows and one column, each of the m reference cells including a variable resistance element having a same configuration as the variable resistance element of each of the memory cells, and one fixed resistor commonly connected to the m reference cells in series, or m fixed resistors each connected to respective one of the m reference cells in series, the variable resistance elements of the reference cells being set to low resistance;
a reference voltage conversion circuit that converts a resistance value of a series circuit of one of the reference cells to be read and the fixed resistor to a reference voltage; and
n sense amplifiers each of which is arranged in respective columns, and determines data stored in the memory cells by comparing the reference voltage with the data voltage output from the resistance voltage conversion circuit of a corresponding column;
the reference voltage conversion circuit including a line which extends across at least one of n columns and supplies the reference voltage to the n sense amplifiers, and
a write-back circuit which writes the latched data back into the memory cell from which the data is readout.

8. The storage circuit according to claim 7, further comprising selection transistors each of which has a current path connected to respective one of the memory cells in series;
each of the n resistance voltage conversion circuits includes a bit line and a source line,
each series circuit of the memory cell and the selection transistor is connected between the respective bit line and the respective source line; and
the write back circuit applies, between respective bit line and respective source line, a voltage for flowing a current to write the latched data into the memory cell from which the data is readout.

* * * * *